(12) United States Patent
Peyton et al.

(10) Patent No.: US 9,395,399 B2
(45) Date of Patent: Jul. 19, 2016

(54) SIGNAL PROCESSING APPARATUSES AND METHODS FOR IDENTIFYING CABLE CONNECTIONS BETWEEN PORTS

(71) Applicant: Cable Sense Limited, Lancaster (GB)

(72) Inventors: Anthony Peyton, Bolton (GB); John Kelly, Morecambe (GB)

(73) Assignee: CABLE SENSE LIMITED, Lancaster (GB)

( * ) Notice: Subject to any disclaimer, the term of this patent is extended or adjusted under 35 U.S.C. 154(b) by 630 days.

(21) Appl. No.: 13/692,933

(22) Filed: Dec. 3, 2012

(65) Prior Publication Data

US 2013/0093434 A1    Apr. 18, 2013

Related U.S. Application Data

(63) Continuation of application No. PCT/GB2011/000800, filed on May 25, 2011.

(51) Int. Cl.
| | |
|---|---|
| G01R 31/02 | (2006.01) |
| H04B 3/487 | (2015.01) |
| G01R 31/00 | (2006.01) |
| H04M 3/34 | (2006.01) |

(52) U.S. Cl.
CPC ............. G01R 31/001 (2013.01); H04B 3/487 (2015.01); H04M 3/34 (2013.01)

(58) Field of Classification Search
CPC ......... H04L 43/50; H04B 3/487; G01R 31/02
See application file for complete search history.

(56) References Cited

U.S. PATENT DOCUMENTS

| | | | |
|---|---|---|---|
| 5,483,467 A | 1/1996 | Krupka et al. | |
| 6,222,908 B1 | 4/2001 | Bartolutti et al. | |
| 6,285,293 B1 | 9/2001 | German et al. | |
| 7,081,763 B1 * | 7/2006 | Zhu et al. | 324/628 |

(Continued)

FOREIGN PATENT DOCUMENTS

| | | |
|---|---|---|
| EP | 1246398 | 10/2002 |
| EP | 2073519 | 6/2009 |

(Continued)

OTHER PUBLICATIONS

International Search Report and Written Opinion issued in related PCT Patent Application PCT/GB2011/000800, dated Aug. 10, 2011, 14 pages.

*Primary Examiner* — Tung X Nguyen
*Assistant Examiner* — Feba Pothen
(74) *Attorney, Agent, or Firm* — Lathrop & Gage LLP

(57) ABSTRACT

Apparatuses and methods for analyzing at least one characteristic of a test signal coupled out from one of a plurality of cable lines by a coupling unit to determine whether that test signal has propagated directly to the coupling unit via a single cable line or has propagated indirectly to the coupling unit via one or more coupling paths between different cable lines. The determination of whether the test signal has propagated directly to the coupling unit via a single cable line or has propagated indirectly to the coupling unit via one or more coupling paths between different cable lines, may advantageously be used for operational or diagnostic purposes, e.g. to identify interconnections between ports in a network.

16 Claims, 12 Drawing Sheets

(56) References Cited

U.S. PATENT DOCUMENTS

2004/0213216 A1  10/2004  Barrass et al.
2005/0194978 A1* 9/2005  Smith ........................... 324/527
2007/0047631 A1* 3/2007  Bostoen et al. ............... 375/222
2008/0042688 A1* 2/2008  Lai et al. ...................... 326/82
2008/0201092 A1* 8/2008  Connolly ...................... 702/67

FOREIGN PATENT DOCUMENTS

| GB | 2120044 | 11/1983 |
| WO | 00/60475 | 10/2000 |
| WO | 2004/092911 | 10/2004 |
| WO | 2005/109015 | 11/2005 |
| WO | 2010/109211 | 9/2010 |

* cited by examiner

SIGNAL PROCESSING APPARATUSES AND METHODS FOR IDENTIFYING CABLE CONNECTIONS BETWEEN PORTS

RELATED APPLICATION

This application is a continuation of PCT Patent Application PCT/GB2011/000800, filed May 25, 2011, which claims priority to Great Britain Patent Application 1009184.1, filed Jun. 1, 2010, the disclosure of which is incorporated herein by reference.

BACKGROUND OF THE INVENTION

This invention relates to signal processing apparatuses and methods for use with a plurality of cable lines, e.g. cable lines including one or more twisted pair cables. In particular, this invention relates to apparatuses and methods for analysing one or more characteristics of a test signal coupled out from one of a plurality of cable lines. In some examples, the invention relates to a network interconnection identification apparatus for identifying interconnections between ports in a network.

Cables which include a plurality of twisted pairs, referred to as "twisted pair cables" herein, are well known. Such cables are commonly used for telecommunications purposes, e.g. computer networking and telephone systems. In the field of telecommunications, twisted pair cables are usually provided without shielding, as unshielded twisted pair (UTP) cables. However, shielded twisted pair (STP) cables are also known.

In this context, a "twisted pair" is a pair of conductors, usually a forward conductor and a return conductor of a single circuit, which have been twisted together. The conductors are usually twisted together for the purposes of cancelling out electromagnetic interference from external sources and to minimise crosstalk between neighbouring twisted pairs within a cable comprising a plurality of twisted pairs. In this way, each twisted pair provides a reliable respective communication channel for a signal, usually a differential voltage signal, to be conveyed within the twisted pair. Common forms of unshielded twisted pair (UTP) cables are category 5 and category 6 UTP cables which include eight conductors twisted together in pairs to form four twisted pairs.

The design and construction of twisted pair cables is carefully controlled by manufacturers to reduce noise due to electromagnetic interference and to reduce crosstalk between the twisted pairs within the cables. To this end, each twisted pair in a twisted pair cable normally has a different twist rate (i.e. number of twists per unit length along the cable) from that of the other twisted pairs in the twisted pair cable. It is also usual for the twisted pairs to be twisted around each other within the cable. Fillets or spacers may be used to separate physically the twisted pairs.

Networks including ports interconnected by a plurality of cables, such as local area networks (LANs), are also well known. LANs are typically used to enable equipment such as computers, telephones, printers and the like to communicate with each other and with remote locations via an external service provider. LANs typically utilise twisted pair network cables, usually in the form of UTP cables.

The cables used in LANs are typically connected to dedicated service ports throughout one or more buildings. The cables from the dedicated service ports can extend through the walls, floor and/or ceilings of the building to a communications hub, typically a communications room containing a number of network cabinets. The cables from wall and floor sockets within the building and from an external service provider are also usually terminated within the communications room.

A "patch system" may be used to interconnect various ports of the LAN within the network cabinets. In a patch system, all cable lines in the LAN can be terminated within the network cabinets in an organized manner. The terminations of the cable lines in the network are provided by the structure of the network cabinets, which are typically organised in a rack system. The racks contain "patch panels", which themselves utilise sets of ports, typically RJ-45 type connector ports, at which the cable lines terminate.

Each of the ports in each patch panel is hard wired to one of the cable lines in the LAN. Accordingly, each cable line is terminated on a patch panel in an organized manner. In small patch systems, all cable lines in the LAN may terminate on the patch panels of the same rack. In larger patch systems, multiple racks are used, wherein different cable lines terminate on different racks.

Interconnections between the various ports in the LAN are typically made using "patch cables", which are usually UTP cables including four twisted pairs. Each end of a patch cable is terminated by a connector, such as an RJ-45 type connector for inserting into an RJ-45 type connector port. One end of each patch cable is connected to the port of a first cable line and the opposite end of the patch cable is connected to the port of a second cable line. By selectively connecting the various cable lines using the patch cables, a desired combination of network interconnections can be achieved.

FIG. 12 shows a typical patch system organised into a server row 92, a cross-connect row 93 and a network row 94, which include patch panels 96a, 96b, 96c, 96d. Patch cables 10a, 10b, 10c, 10d are used to interconnect two ports through the patch system.

In many businesses, employees of a company are assigned their own computer network access number so that the employee can interface with the company's IT infrastructure. When an employee changes office locations, it is not desirable to provide that employee with newly addressed port in the network. Rather, to preserve consistency in communications, it is preferred that the exchanges of the ports in the employee's old office be transferred to the telecommunications ports in the employee's new location. This type of move is relatively frequent. Similarly, when new employees arrive and existing employees depart, it is usually necessary for the patch cables in the network cabinet(s) to be rearranged so that each employee's exchanges can be received in the correct location.

As the location of employees change, the patch cables in a typical cabinet are often manually entered in a computer based log. This is burdensome. Further, technicians often neglect to update the log each and every time a change is made. Accordingly, the log is often less than 100% accurate and a technician has no way of reading where each of the patch cables begins and ends. Accordingly, each time a technician needs to change a patch cable, that technician manually traces that patch cable between an internal line and an external line. To perform a manual trace, the technician locates one end of a patch cable. The technician then manually follows the patch cable until he/she finds the opposite end of that patch cable. Once the two ends of the patch cable are located, the patch cable can be positively identified.

It takes a significant amount of time for a technician to manually trace a particular patch cable, especially in large patch systems. Furthermore, manual tracing is not completely accurate and a technician may accidently go from one patch cable to another during a manual trace. Such errors result in misconnected patch cables which must be later identified and corrected.

Attempts have been made in the prior art to provide an apparatus which can automatically trace the common ends of each patch cable within local area networks, thereby reducing the labour and inaccuracy of manual tracing procedures.

For example, U.S. Pat. No. 5,483,467 describes a patching panel scanner for automatically providing an indication of the connection pattern of the data ports within a LAN, so as to avoid the manual task of identifying and collecting cable connection information. In one embodiment, which is intended for use with shielded twisted pair cables, the scanner uses inductive couplers which are associated with the data ports. The inductive coupler is disclosed as being operative to impose a signal on the shielding of shielded network cables in order to provide an indication of the connection pattern produced by connection of the cables to a plurality of ports.

In another embodiment of U.S. Pat. No. 5,483,467, the scanner is coupled to each data port by "dry contact" with a dedicated conductor in a patch cable. This is difficult to implement in practice, because most network cables have to meet a particular pre-determined standard in the industry, such as the RJ-45 type standard, in which there is no free conductor which could be used for determining interconnectivity.

U.S. Pat. No. 6,222,908 discloses a patch cable identification and tracing system in which the connectors of each patch cable contain a unique identifier which can be identified by a sensor in the connector ports of a telecommunications closet. By reading the unique identifier on the connectors of each patch cable, the system can keep track of which patch chords are being added to and removed from the system. Although this system avoids the use of dedicated conductors in the patch cable, it is difficult to implement because it requires use of non-standard patch cables, i.e. patch cables with connectors containing unique identifiers.

International Patent Application Publication Number WO00/60475 discloses a system for monitoring connection patterns of data ports. This system uses a dedicated conductor which is attached to the external surface of a network cable in order to monitor the connection pattern of data ports. Although this allows the system to be used with standard network cables, it still requires the attaching of dedicated conductors to the external surfaces of network cables and adapter jackets which are placed over the standard network cable.

U.S. Pat. No. 6,285,293 discloses another system and method for addressing and tracing patch cables in a dedicated telecommunications system. The system includes a plurality of tracing interface modules that attach to patch panels in a telecommunications closet. On the patch panels, are located a plurality of connector ports that receive the terminated ends of patch cables. The tracing interface modules mount to the patch panels and have a sensor to each connector port which detects whenever a patch cable is connected to the connector port. A computer controller is connected to the sensors and monitors and logs all changes to the patch cable interconnections in an automated fashion. However, this system cannot be retrofitted to an existing network and relies on the operator to work in a particular order if the patch cable connections are to be accurately monitored.

International Patent Application Publication Number WO2005/109015, which relates to the field of cable state testing, discloses a method of determining the state of a cable comprising at least one electrical conductor and applying a generated test signal to at least one conductor of the cable by a non-electrical coupling transmitter. The reflected signal is then picked up and compared with expected state signal values for the cable, so that the state of the cable can be determined. The present inventors have found that signals coupled to a twisted pair cable by the methods described in WO2005/109015 have a tendency to leak out from the twisted pair cable, especially when other twisted pair cables are nearby.

UK patent application number GB0905361.2, U.S. patent application Ser. No. 11/597,575 and International patent application number PCT/GB2010/000594, also by the present inventors, and the content of which is herewith incorporated in its entirety, describe apparatuses and methods for coupling a signal to and from a twisted pair cable by non-contact coupling with twisted pairs in the twisted pair cable, such that the signal propagates along the cable between at least two of the twisted pairs. These methods and apparatuses related to a discovery by the present inventors that a twisted pair cable provides communication channels (referred to as "pair-to-pair channels") between the twisted pairs within the twisted pair cable, these communication channels being additional to the respective communication channel provided within each twisted pair in the cable. In other words, a signal propagating between the twisted pairs could be transmitted on a standard UTP cable (i.e. with no specially adapted UTP cable needed) without interfering with signals propagating within individual twisted pairs of the standard UTP cable.

"Crosstalk" is a common problem within the field of networks. "Crosstalk" may be viewed as undesired signal coupling from one signal channel to another. For networks including a plurality of twisted pair cables, crosstalk may occur between the twisted pairs within individual twisted pair cables, but most commonly occurs between twisted pairs in different twisted pair cables, particularly when the twisted pairs have a similar twist rate. In industry, crosstalk between different twisted pair cables is sometimes referred to as "alien" crosstalk and is illustrated by FIG. 1b, which is described in more detail below.

The presence of crosstalk between twisted pair cables can cause serious difficulties for the operation of a network as it can cause signals to be routed via undesired paths between ports in the network. To address these difficulties, cables (e.g. category 5 and category 6 UTP cables), connectors and associated components are normally manufactured to ensure that levels of crosstalk are maintained within prescribed standards. In addition, cables must often be installed and connected according to guidelines in order to ensure that the network performs to the prescribed standards.

SUMMARY OF THE INVENTION

The present invention has been devised in light of the above considerations.

The present invention relates to a discovery by the present inventors that the characteristics of a test signal coupled out from one of a plurality of cable lines by a coupling unit are different depending on whether that test signal has propagated directly to the coupling unit via a single cable line or has propagated indirectly to the coupling unit via one or more coupling paths between different cable lines. By analysing one or more characteristics of such a test signal, the present inventors have found that it is possible to determine whether the test signal has propagated directly to the coupling unit via a single cable line or has propagated indirectly to the coupling unit via one or more coupling paths between different cable lines.

Accordingly, in general, the invention provides apparatuses and methods for analysing at least one characteristic of a test signal coupled out from one of a plurality of cable lines by a coupling unit to determine whether that test signal has propagated directly to the coupling unit via a single cable line or has propagated indirectly to the coupling unit via one or more coupling paths between different cable lines.

The determination of whether the test signal has propagated directly to the coupling unit via a single cable line or has propagated indirectly to the coupling unit via one or more coupling paths between different cable lines, may advantageously be used for operational or diagnostic purposes, e.g. to identify interconnections between ports in a network.

Herein, for brevity, a test signal which has propagated directly between a first coupling unit and a second coupling unit via a single cable line is referred to as a "direct signal" and a signal which has propagated between the first coupling unit and second coupling unit via a coupling path extending between different cable lines is referred to as a "crosstalk signal". As explained in more detail below, the present inventors have found that a direct signal has different characteristics (e.g. in the time and frequency domains) from a crosstalk signal. This difference is illustrated, for example, by FIGS. 1a and 1b, which are described in more detail below.

In a first aspect, the present invention provides a signal processing apparatus as set out in claim 1.

In other words, the signal processing apparatus is able to distinguish between a direct signal and a crosstalk signal. In this way, the signal processing apparatus is different from the apparatuses described in UK patent application number GB0905361.2, U.S. patent application Ser. No. 11/597,575 and International patent application number PCT/GB2010/000594, also by the present inventors, since the apparatuses described in these patent applications are not configured to distinguish between these different types of signal.

Here, it should be appreciated that a determination by the signal processing unit that condition (i) is true indicates that the first cable line is also the second cable line. Likewise, it should be appreciated that a determination by the signal processing unit that condition (ii) is true indicates that the first cable line is different from the second cable line.

Here, it should also be appreciated that the signal processing unit may not be able to determine which of conditions (i) and (ii) is true for each and every second test signal coupled out by the second coupling unit. This might be the case, for example, if the second test signal does not result from a first test signal coupled into a first cable line by the first coupling unit. This might also be the case, for example, if the signal processing unit needs to analyse the characteristics of a plurality of second test signals, before it has enough information to determine whether condition (i) or (ii) is true for any one or more of those second test signals.

Herein, the term "cable" refers to a single cable including at least two conductors. The term "cable line" refers to either one such cable or to a plurality of such cables whose conductors have been directly, i.e. by direct electrical (ohmic) contact, coupled together.

Herein, when it is described herein that a signal propagates "between" at least two conductors in a cable line, it is meant that the signal propagates along the cable line due to a coupling between the conductors, the signal being difference in state between the conductors. Such a signal is commonly referred to as "differential" signal. A differential signal is therefore distinguished from a so-called "common mode" signal, where all the conductors have substantially the same state and the signal is a difference in state between all the conductors and an external reference (e.g. ground).

For example, a signal that propagates between at least two conductors in a cable line may be a voltage signal, i.e. a difference in voltage between at least two conductors in the cable line, which propagates along the cable line due to inductive and capacitive coupling between at least two conductors. Here, the capacitance per meter and inductance per meter will generally determine e.g. the speed of propagation of such a voltage signal.

For the avoidance of doubt, when a signal is described herein as propagating along a cable line, the signal does not have to propagate along the entire length of the cable line. Likewise, when a signal is described herein as having propagated along a cable line, the signal does not have to have propagated along the entire length of the cable line.

The signal processing apparatus may include the plurality of cable lines. The signal processing apparatus may include a network that includes the plurality of cable lines. The network may include a plurality of ports, which may be interconnected by the plurality of cable lines.

Although the apparatus may have only one first coupling unit and only one second coupling unit, the apparatus preferably includes a plurality of first coupling units and/or a plurality of second coupling units.

Preferably, the apparatus has a plurality of first coupling units, each first coupling unit being configured to couple to a respective first one of the plurality of cable lines and to couple a respective first test signal generated by the signal generating unit into the respective first cable line such that the respective first test signal propagates along the respective first cable line between at least two conductors in the respective first cable line.

Where there is a plurality of first coupling units, the first coupling units are preferably configured to couple respective first test signals generated by the test signal generating unit one at a time. In this way, interference between test signals in the plurality of cable lines, e.g. due to crosstalk, can be avoided. Also, coupling in first test signals one at a time may help the signal processing unit to determine which first coupling unit coupled in a first test signal that resulted in one or more second test signals subsequently coupled out by a plurality of second coupling units. Determining which first coupling unit coupled in a first test signal that resulted in one or more second test signals may be useful, for example, in helping the signal processing unit to identify interconnections between ports in a network.

Preferably, the apparatus includes a plurality of second coupling units, each second coupling unit being configured to couple to a respective second one of the plurality of cable lines and, if a respective second test signal is present in the respective second cable line, to couple the respective second test signal out from the respective second cable line.

Where there is a plurality of second coupling units, the signal processing unit is preferably configured to, if any one or more of the second coupling units couples out a respective second test signal, analyse one or more characteristics of the or each respective second test signal to determine, for at least one respective second test signal, based on the one or more analysed characteristics, which of the following conditions, if any, is true: (i) the respective second test signal is a direct signal that has propagated directly from a first coupling unit to a second coupling unit via a single cable line to which the first and second coupling units are coupled; (ii) the respective second test signal is a crosstalk signal that has propagated indirectly from a first coupling unit to the second coupling unit via one or more coupling paths between different cable lines to which the first and second coupling units are respectively coupled.

Here, it should be appreciated that a determination that condition (i) is true for a respective second test signal indicates that the respective second test signal has resulted from a first test signal that was coupled by a first coupling unit into a first cable line that is also the second cable line from which the respective second test signal was coupled out. Likewise, it should be appreciated that a determination that condition (ii) is true for a respective second test signal indicates that the respective second test signal has resulted from a first test signal that was coupled by a first coupling unit into a first cable line that is different from the second cable line from which the respective second test signal was coupled out.

In some embodiments, the signal processing unit may be configured to analyse only the one or more characteristics of a respective second test signal to determine, for that second test signal, whether condition (i) or (ii) is true. However, it is equally possible for the signal processing unit to be configured to analyse one or more characteristics of each of a plurality of respective second test signals to determine, for one or more of the respective second test signals, whether condition (i) or (ii) is true.

The determination by the signal processing unit of which, if any, of conditions (i) and (ii) is true for a second test signal may advantageously be used for operational or diagnostic purposes.

Preferably, the determination by the signal processing unit is used to identify interconnections between ports in a network including a plurality of cable lines. Accordingly, the test signal processing apparatus is preferably implemented as a network interconnection identification apparatus for identifying interconnections between ports in a network including a plurality of cable lines. To this end, the signal processing unit is preferably configured to, if it determines that a second test signal coupled out by a second coupling unit is a direct signal that has propagated directly from a first coupling unit to the second coupling unit via a single cable line to which the first and second coupling units are coupled, identify an interconnection between a first port associated with that first coupling unit and a second port associated with that second coupling unit. The or each first coupling unit may be associated or associable with a respective first port in a network and the or each second coupling unit may be associated or associable with a respective second port in the network.

The signal processing unit may additionally or alternatively be configured to, if it determines that a second test signal coupled out by a second coupling unit is a crosstalk signal, measure the magnitude of the crosstalk signal. The magnitude of the crosstalk signal could be measured using techniques well known to those skilled in the art of signal processing. The measured magnitude of the crosstalk signal could be used, for example, to determine if there is too much crosstalk between ports in a network. Too much crosstalk may be a symptom of cables running too close to each other, and could therefore indicate to a network operator that cables in the network need to be separated.

The first test signal generated by the signal generating unit may be any signal having characteristics such that, when the first test signal is coupled into one of a plurality of cables by a first coupling unit, the characteristics of a resulting second test signal coupled out from one of the plurality of cables by a second coupling unit can be analysed to determine whether the resulting second test signal is a direct signal or crosstalk signal. The present inventors have found that signals suitable for performing time domain reflectometry or frequency domain reflectometry are suitable. Accordingly, the signal generating unit may be configured to generate a first test signal suitable for performing time domain reflectometry and/or a first test signal suitable for performing frequency domain reflectometry.

In time domain reflectometry, a system response is measured as a function of time. A test signal suitable for time domain reflectometry might be, for example, an impulse or narrow transient test signal, e.g. having a duration of less than 10 ns (which corresponds to an electrical length of 2 meters).

In frequency domain reflectometry, a system response is measured as a function of frequency. A test signal suitable for frequency domain reflectometry might be, for example, a frequency swept sine wave or pseudo random noise. Frequency domain information can be converted into a corresponding time domain response via an inverse Fourier transform, as would be known to those skilled in the art.

Preferably, the signal generating unit is configured to generate a first test signal that is a voltage signal.

As would be appreciated by a person skilled in the art of signal processing, a large number of different characteristics of a second test signal could be analysed to determine whether a second test signal is a direct signal or a crosstalk signal. Some of these characteristics, and techniques for analysing these characteristics to distinguish between direct signals and crosstalk signals are discussed below with reference to FIGS. 6-11.

For example, the one or more characteristics of the or each second test signal analysed by the signal processing unit may include any one or more of the following characteristics: the amplitude of the second test; the amplitude of the second test signal as measured at a plurality of frequencies; an amplitude-frequency characteristic of the second test signal; an amplitude-distance characteristic of the second test signal; and an amplitude-time characteristic of the second test signal. However, this list of characteristics is not thought by the present inventors to be exhaustive. For example, the one or more characteristics of the or each second test signal analysed by the signal processing unit may equally include any one or more of the phase of the second test signal; or the phase of the second test signal as measured at a plurality of frequencies.

For completeness, it is observed that as the velocity of a signal propagating along a cable is generally constant, time is proportional to distance and therefore an amplitude-distance characteristic can also be considered to be an amplitude-time characteristic.

In some embodiments, the signal generating unit may be configured to generate a first test signal of a first type and a first test signal of a second type. The first and second types of first test signal could, for example, be suitable for performing different types of analysis. Preferably, the signal processing unit is configured to analyse one or more characteristics of second test signals of the first type and second test signals of the second type.

Preferably, the first type of test signal is a frequency domain test signal and the second type of test signal is a frequency domain test signal, with the first type of test signal containing fewer frequency values than the second type of test signal. Thus, for example, the first test signal of the first type could be a frequency swept sine wave containing only eight different frequency values, with the first test signal of the second type being a frequency swept sine wave containing one hundred and twenty eight different frequency values.

If there is a plurality of the second coupling units, the signal processing unit may be configured to, if more than one of the second coupling units couples out a respective second test signal of a first type, analyse one or more characteristics of each respective second test signal of the first type to establish a shortlist of second coupling units, the shortlist including the second coupling units which are identified as having potentially coupled out a direct signal. In this case, the signal processing unit is preferably further configured to, if more than one of the shortlisted second coupling units couples out a respective second test signal of a second type, analyse one or more characteristics of each respective second test signal of the second type to determine which, if any, of the respective second test signals of the second type is a direct signal.

In this way, the time taken to determine which of a plurality of second coupling units has coupled out a direct signal can be reduced if, for example, analysis of the second type of test signal takes longer, but is more accurate than, the analysis of the first type of test signal. This might be the case, for example, if the first and second types of test signal are both frequency domain test signals, with the first type of test signal containing fewer frequency values than the second type of test signal, since a frequency domain test signal containing a larger number of frequency values will generally take longer to analyse but will generally permit a more accurate determination of whether that test signal is a direct signal or a crosstalk signal.

The plurality of cable lines with which the apparatus may be used could be any type of cable line in which the one or more cables each have at least two conductors. However, preferably, the plurality of cable lines each include one or more twisted pair cables, i.e. cables including a plurality of twisted pairs.

Preferably, the or each first coupling unit is configured to couple a respective first test signal generated by the signal generating unit into a respective first one of the plurality of cable lines such that the respective first test signal propagates along the respective first cable line between at least two twisted pairs in the respective first cable line. Also preferably, the or each second coupling unit is configured to couple a respective second test signal out from a respective second one of the plurality of cable lines after it has propagated between at least two twisted pairs in the respective second cable line.

Preferably, the or each first coupling unit is configured to couple a respective first test signal into a respective first one of the plurality of cable lines by non-contact coupling with the conductors of the respective first cable line. In this context, non-contact coupling refers to coupling that does not involve direct electrical (ohmic) contact with the conductors of the cable line. Likewise, the or each second coupling unit is preferably configured to couple a respective second test signal out from a respective second one of the plurality of cable lines by non-contact coupling with the conductors of the respective second cable line. However, it is equally possible, and would be within the capability of a person skilled in the art of signal processing, to instead use first and second coupling units configured to couple to cable lines by direct electrical (ohmic) contact with the conductors of the cable lines.

Coupling units capable of coupling a test signal generated by a signal generating unit into (or out from) a twisted pair cable line by non-contact coupling so that the signal propagates (or after the signal has propagated) between at least two twisted pairs in the twisted pair cable line are described below with reference to FIGS. 3-5, and also in UK patent application number GB0905361.2, U.S. patent application Ser. No. 11/597,575 and International patent application number PCT/GB2010/000594, also by the present inventors.

Accordingly, the or each first coupling unit may include any one or more of the following features: first and second electrodes arranged to produce an electric field therebetween to couple a voltage signal (which may, for example, be a first test signal generated by the signal generating means) into a twisted pair cable by non-contact coupling with twisted pairs in the twisted pair cable so that the voltage signal propagates along the twisted pair cable between at least two of the twisted pairs; electrical isolation means (e.g. a balun) arranged to electrically isolate the electrodes from the signal generating unit; shielding for shielding the electrodes from an external electromagnetic field; means for converting (e.g. a choke) a single-ended voltage signal from a signal generating unit into a differential voltage signal to be coupled to the electrodes; and a housing which may be arranged to be clipped onto a twisted pair cable.

Likewise, the or each second coupling unit may include any one or more of the following features: first and second electrodes arranged to couple a voltage signal (which may, for example, be a second test signal resulting from a first test signal coupled into one of the plurality of cable lines by a first coupling unit) out from a twisted pair cable by non-contact coupling with at least two of the twisted pairs in the twisted pair cable between which the voltage signal has propagated; electrical isolation means (e.g. a balun) arranged to electrically isolate the electrodes from the signal processing unit; shielding for shielding the electrodes from an external electromagnetic field; means for converting (e.g. a choke) a differential voltage signal from the electrodes into a single-ended voltage signal to be coupled to a signal processing unit; a housing which may be arranged to be clipped onto a twisted pair cable.

The combination of the first and second electrodes with the electrical isolation means has been found to be particularly preferable for reducing crosstalk between twisted pair cables, as discussed in UK patent application number GB0905361.2, U.S. patent application Ser. No. 11/597,575 and International patent application number PCT/GB2010/000594, also by the present inventors.

In a second aspect, the present invention provides a signal processing method according to claim 14.

The method may include any of the features, or method steps corresponding to the features, described in relation to the first aspect.

Accordingly, the method may, for example, include coupling, using each of a plurality of second coupling units, a respective second test signal out from a respective second one of the plurality of cable lines; and analysing one or more characteristics of each respective second test signal to determine, for at least one respective test signal, based on the one or more analysed characteristics, which, if any, of conditions (i) and (ii) is true.

Likewise, the method may, for example, further include: if it is determined that a second test signal coupled out by a second coupling unit is a direct signal that has propagated directly from a first coupling unit to the second coupling unit via a single cable line to which the first and second coupling units are coupled, identifying an interconnection between a first port associated with that first coupling unit and a second port associated with that second coupling unit.

The invention also includes any combination of the aspects and preferred features described except where such a combination is clearly impermissible or expressly avoided.

BRIEF DESCRIPTION OF THE DRAWINGS

Embodiments of our proposals are discussed below, with reference to the accompanying drawings in which.

DETAILED DESCRIPTION OF THE DRAWINGS

Figure 1A:
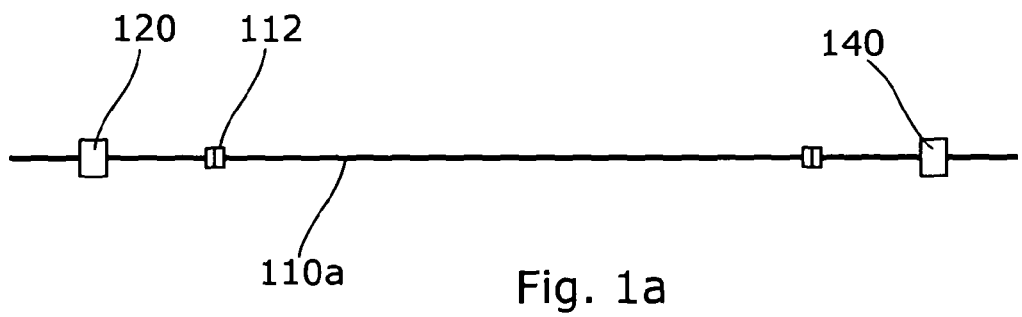
FIGS. 1a and 1b respectively show arrangements which illustrate a "direct signal" and a "crosstalk signal".

FIG. 1a shows an arrangement which illustrates a "direct signal". The arrangement of FIG. 1a includes a first cable line 110a, a first ("transmitter) coupling unit 120 and a second ("receiver") coupling unit 140. The first coupling unit 120 is configured to couple to a first one of a plurality of cable lines and to couple a first test signal into that first cable line such that the first test signal propagates along that first cable line between at least two conductors in that first cable line. The second coupling unit 140 is configured to couple to a second one of a plurality of cable lines and, if a second test signal is present in that second cable line, to couple the second test signal out from that second cable line.

In FIG. 1a, both the first coupling unit 120 and the second coupling unit 140 are coupled to the same cable line, i.e. the first cable line 110a. Accordingly, a second test signal coupled out from the first cable line 110a by the second coupling unit 140 will have propagated directly from the first coupling unit 120 to the second coupling unit 140 via a single cable line. A test signal which has propagated in this way can therefore be referred to as a "direct signal".

Figure 1B:
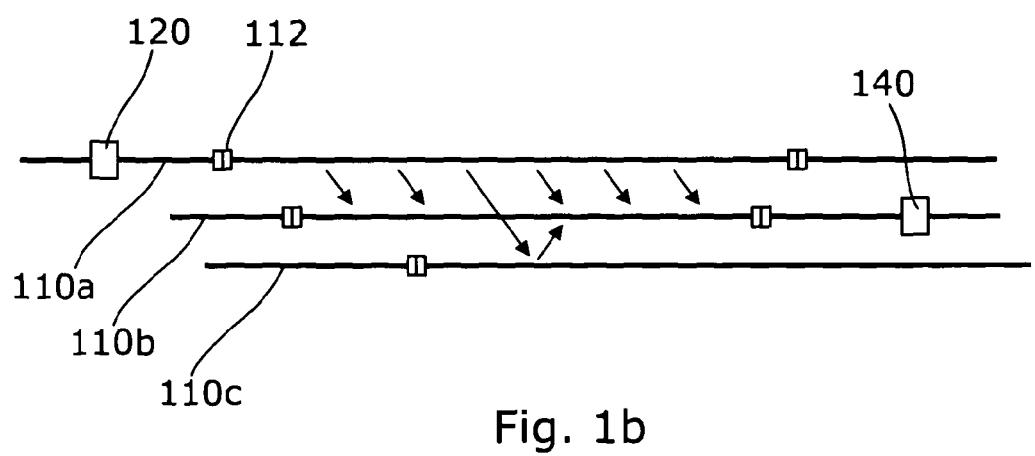

FIG. 1b shows an arrangement which illustrates a "crosstalk signal". The arrangement of FIG. 1b is the same as that of FIG. 1a, except that there are additional second and third cables lines 110b, 110c, and the second coupling unit 140 is coupled to a different cable line from the first coupling unit 120, i.e. to the second cable line 110b rather than the first cable line 110a. Accordingly, a second test signal coupled out from the second cable line 110b by the second coupling unit 140 will have propagated indirectly from the first coupling unit 120 to the second coupling unit 140 via one or more coupling paths between different cable lines. A test signal which has propagated in this way can therefore be referred to as a "crosstalk signal". The word "alien" may optionally be used to describe this crosstalk signal so as to indicate that the crosstalk occurs between different cable lines, rather than within a single cable line.

The one or more coupling paths between the first cable line 110a and the second cable line 110b are symbolically indicated in FIG. 1b by arrows. These coupling paths typically include unwanted capacitive and/or inductive coupling paths and may involve cable lines other than those to which the first coupling unit 120 and second coupling unit 140 are respectively coupled, e.g. the third cable line 110c shown in FIG. 1b.

Note that in FIGS. 1a and 1b, each of the first, second and third cable lines 110a, 110b, 110c includes a plurality cables (e.g. UTP cables) whose conductors are directly coupled together by appropriate connectors 112, e.g. RJ-45 type connectors. However, each of the cable lines 110a, 110b, 110c could include only one cable. In either case, the crosstalk signal is different to the direct signal in that it has propagated between different cable lines via one or more (non-ohmic, e.g. capacitive or inductive) coupling paths.

Figure 2:
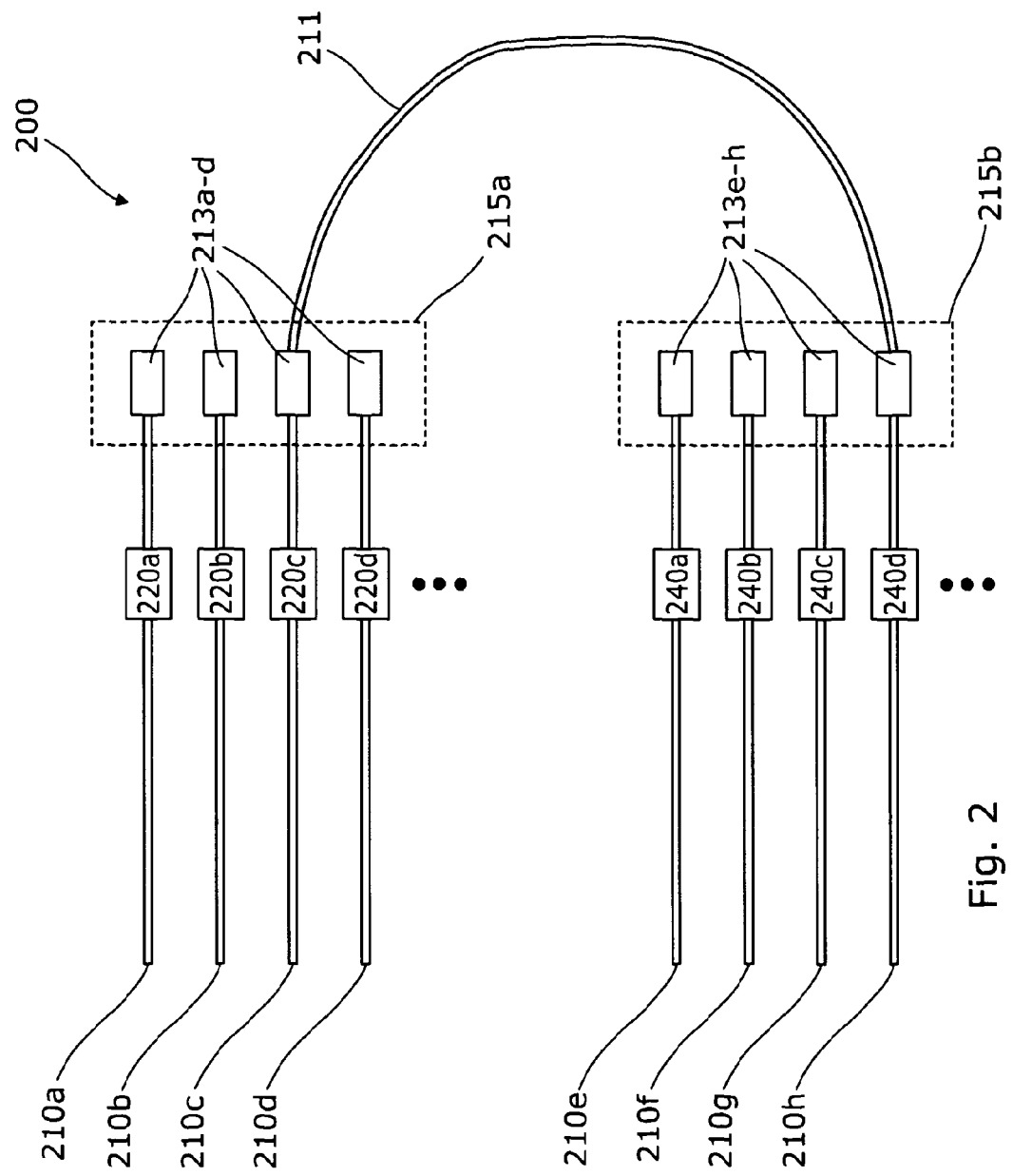
FIG. 2 shows a test signal processing apparatus implemented as a network interconnection identification apparatus.

FIG. 2 shows a test signal processing apparatus implemented as a network interconnection identification apparatus 200 for identifying interconnections between ports in a network including a plurality of cable lines.

FIG. 2 additionally shows a network including plurality of first cable lines 210a-d connected to a plurality of first ports 213a-d housed in a first patch panel 215a. The first cable lines 210a-d may, for example, lead to file servers and switches in a local area network. The network also includes plurality of second cable lines 210e-h connected to a plurality of second ports 213e-h housed in a second patch panel 215b. The first ports 213a-d and second ports 213e-h are interconnected by a plurality of patch cables 211, although for clarity, only one of the patch cables 211 is shown in FIG. 2.

The network interconnection identification apparatus 200 shown in FIG. 2 has a plurality of first coupling units 220a-d and a signal generating unit (not shown). The signal generating unit included in the network identification apparatus 200 may, for example, be as described below with reference to FIG. 5a.

Each first coupling unit 220a-d is coupled to a respective first cable line 210a-d, is associated with a respective port 213a-d in the first patch panel, and is configured to couple a respective first test signal generated by the signal generating unit into the respective first cable line 210a-d such that the respective first test signal propagates along the respective first cable line 210a-d between at least two conductors in the respective first cable line 210a-d.

The apparatus of FIG. 2 also has a plurality of second coupling units 240a-d and a signal processing unit (not shown). The signal processing unit included in the network identification apparatus 200 may, for example, be as described below with reference to FIG. 5b.

Each second coupling unit 240a-d is coupled to a respective second cable line 210e-h, is associated with a respective port 213e-h in the second patch panel 215b, and is configured to, if a respective second test signal is present in the respective second cable line 210e-h, to couple the respective second test signal out from the respective second cable line 210e-h. Typically, a respective second test signal coupled out from a respective second cable line 210e-h by one of the second coupling units 240a-d will have resulted from a first test signal coupled into a respective one of the first cable lines 210a-d by one of the first coupling units 220a-d.

The signal processing unit is configured to, if any one or more of the second coupling units 240a-d couples out a respective second test signal, analyse one or more characteristics of the or each respective second test signal to determine, for at least one respective second test signal, based on the one or more analysed characteristics, which of the following conditions, if any, is true:

(i) the respective second test signal is a direct signal that has propagated directly from a first coupling unit 220a-d to a second coupling unit 240a-d via a single cable line to which the first and second coupling units are coupled;

(ii) the respective second test signal is a crosstalk signal that has propagated indirectly from a first coupling unit 220a-d to the second coupling unit 240a-d via one or more coupling paths between different cable lines to which the first and second coupling units are respectively coupled.

Preferably, the signal processing unit is further configured to, if it determines that a second test signal coupled out by a second coupling unit 240a-d is a direct signal that has propagated directly from a first coupling unit 220a-d to the second coupling unit 240a-d via a single cable line to which the first and second coupling units are coupled, identify an interconnection between a first port associated with that first coupling unit 220a-d and a second port associated with that second coupling unit 240a-d.

The signal processing unit may additionally or alternatively be configured to, if it determines that a second test signal coupled out by a second coupling unit is a crosstalk signal, measure the magnitude of the crosstalk signal.

In some embodiments, the signal generating unit may be configured to generate a first test signal of a first type (e.g. a frequency domain test signal containing a relatively small number of frequency values, e.g. eight frequency values) and a first test signal of a second type (e.g. a frequency domain test signal containing a relatively large number of frequency values, e.g. one hundred and twenty eight frequency values). Preferably, the signal processing unit is configured to analyse one or more characteristics of second test signals of the first type and second test signals of the second type.

In some embodiments, the signal processing unit may be configured to, if more than one of the second coupling units 240a-d couples out a respective second test signal of the first type, analyse one or more characteristics of each respective second test signal of the first type to establish a shortlist of second coupling units 240a-d, the shortlist including the second coupling units 240a-d which are identified as having potentially coupled out a direct signal. The signal processing unit is preferably further configured to, if more than one of the shortlisted second coupling units 240a-d couples out a respective second test signal of a second type, analyse one or more characteristics of each respective second test signal of the second type to determine which, if any, of the respective second test signals of the second type is a direct signal.

In FIG. 2, the first cable line 210c is shown as being connected to the second cable line 210h by the patch cable 211, so the first and second cable lines 210c, 210h therefore form part of the same (single) cable line. Accordingly, the first coupling unit 210c and the second coupling unit 210h as shown in FIG. 2 as being coupled to the same cable line.

It should be appreciated that whilst FIG. 2 only shows four of each of the first cable lines 210a-d, the first ports 213a-d, the first coupling units 220a-d, the second cable lines 210e-h, the second ports 213e-h, and the second coupling units, a smaller or larger number of each of these items could easily be used according to network requirements.

Figure 3A:
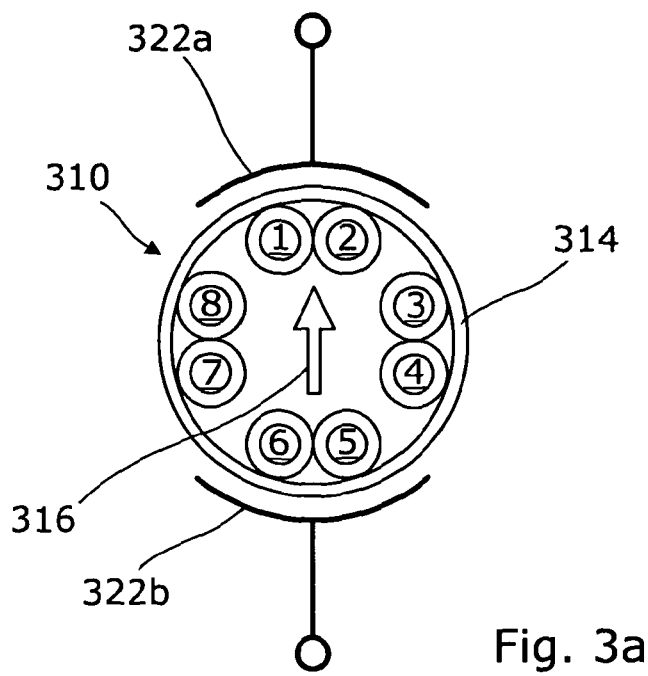
FIGS. 3a and 3b show a pair of electrodes for coupling a voltage signal which propagates between twisted pairs into and out from a twisted pair cable.
Figure 3B:
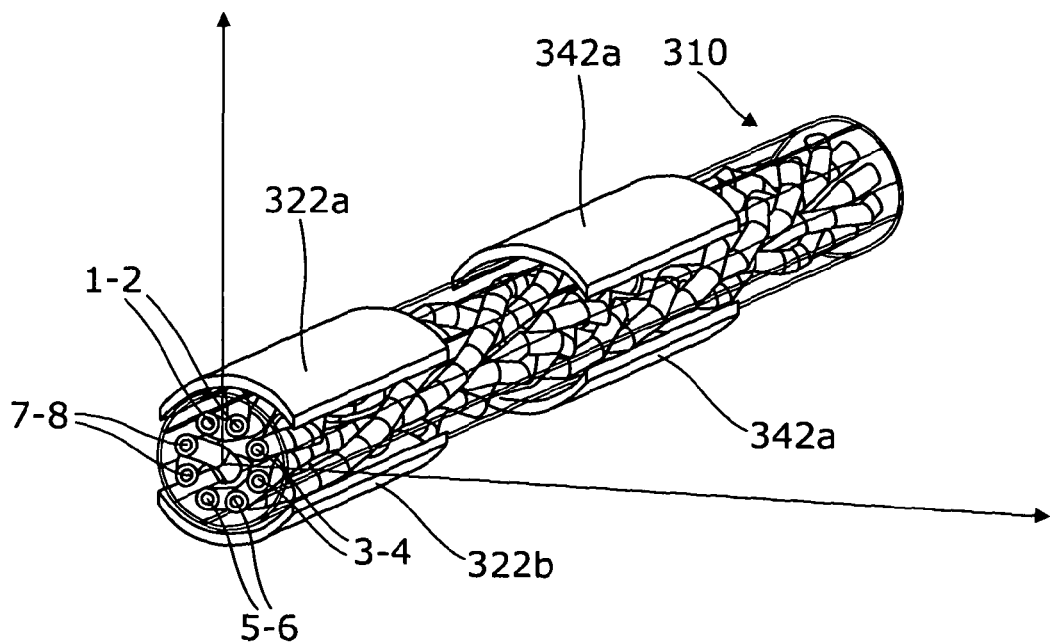

FIGS. 3a and 3b show a pair of electrodes 322a, 322b for coupling a voltage signal which propagates between twisted pairs into and out from a twisted pair cable 310. The pair of electrodes 322a, 322b may be used, for example, in one of the first coupling units 220a-d or one of the second coupling units 240a-d of the network interconnection identification apparatus 200 shown in FIG. 2. The electrodes 322a, 322b shown in FIGS. 3a and 3b are also shown and described in UK patent application number GB0905361.2, U.S. patent application Ser. No. 11/597,575 and International patent application number PCT/GB2010/000594, also by the present inventors.

As shown in FIG. 3a, a first electrode 322a is provided in the form of a first plate and a second electrode 322b is provided in the form of a second plate. The electrodes 322a, 322b together form a capacitor. In this example, the plates forming the first and second electrodes 322a, 322b are approximately 20 mm long and 8 mm wide. The plates may be made of any suitable material e.g. copper foil.

The first and second electrodes 322a, 322b are spaced apart to allow the twisted pair cable 310 to be received therebetween, such that the electrodes 322a, 322b are located on directly opposite sides of the twisted pair cable 310. Each of the plates forming the electrodes 322a, 322b has an inwardly curved (i.e. concave) contact surface for contacting a convex outer surface 314, in this case the outer surface of an insulating sheath, of the twisted pair cable 310. The curvature of the contact surfaces of the plates conform to the curvature of the convex outer surface 314 of the twisted pair cable 310 so that the electrodes 322a, 322b can be held in contact with the convex outer surface 314.

To couple a voltage signal, e.g. from a signal generating unit, into the twisted pair cable 310 by non-contact coupling with the twisted pairs, the voltage signal may be coupled to the electrodes 322a, 322b so that a corresponding electric field 316 is produced between the electrodes 322a, 322b. Because the electric field 316 between the first and second electrodes 322a, 322b is different at twisted pairs 1-2 and 5-6, a voltage is developed between twisted pairs 1-2 and 5-6 which corresponds to the voltage signal coupled to the electrodes 322a, 322b. In this way, the voltage signal can be coupled in to the cable 110 such that it propagates between at least twisted pairs 1-2 and 5-6.

The electrodes 322a, 322b may additionally or alternatively be used to couple a voltage signal out from the twisted pair cable 310 by non-contact coupling with at least two of the twisted pairs between which the voltage signal has propagated, as shall now be described with reference to a voltage signal that is propagating between the twisted pairs 1-2 and 5-6.

The voltage signal propagating between twisted pairs 1-2 and 5-6 of the cable 310 will have an electric field 316 between the twisted pairs 1-2 and 5-6 associated therewith. The electric field 316 may cause a voltage to be developed between the first and second electrodes 322a, 322b which corresponds to the voltage signal between the twisted pairs 1-2 and 5-6. In this way, the voltage signal can be coupled out from the cable 310 by the electrodes 322a, 322b.

FIG. 3b shows the pair of electrodes 322a, 322b shown in FIG. 3a, along with another pair of electrodes 342a, 342b. Electrodes 322a, 322b may be used as the electrodes of a first coupling unit for coupling a voltage signal into the twisted cable 310 such that the signal propagates along the twisted pair cable 310 between at least two twisted pairs in the twisted pair cable 310. Electrodes 342a, 342b may be used as the electrodes of a second coupling unit for coupling a voltage signal out from the twisted pair cable 310 after it has propagated along the twisted pair cable between at least two of the twisted pairs 310.

FIG. 3b also shows the twisted pair cable 310 of FIG. 3a in more detail. As shown in FIG. 3b, not only is each twisted pair 1-2, 3-4, 5-6, 7-8 twisted at a twist rate which is different to that of the other twisted pairs, but all of the twisted pairs are additionally twisted around each other. This is typical in a UTP cable.

Because all the twisted pairs 1-2, 3-4, 5-6, 7-8 of the twisted pair cable 310 are twisted around each other, the electrodes 342a, 342b are not necessarily aligned to be adjacent to the same twisted pairs as the electrodes 322a, 322b of a first coupling unit which coupled a voltage signal into the twisted pair cable 310. Consequently, the strength of the signal receivable by the electrodes 342a, 342b varies between maxima and minima according to their longitudinal position along the twisted pair cable 310. Varying the circumferential position of the electrodes 342a, 342b has a similar effect.

In practice, the inventors have found that a signal of adequate strength can often be received irrespective of the longitudinal/circumferential position of the electrodes 342a, 342b. However, the above-described maxima and minima effect may lead to "null" locations on the twisted pair cable at which the electrodes 342a, 342b cannot couple out a voltage signal. Thus, it may be necessary to adjust the longitudinal/circumferential position of the electrodes 342a, 342b in order for these electrodes to receive (couple out) a voltage signal having a desired strength.

An alternative solution, which avoids the need to adjust the longitudinal/circumferential position of the electrodes 342a, 342b of the second coupling unit, is to have two pairs of electrodes, i.e. four electrodes in total, for coupling a voltage signal to and/or from the twisted pair cable 310 (not shown). For example, if there are two pairs of electrodes for coupling the voltage signal out from the twisted pair cable, an appropriate longitudinal separation between the two pairs of electrodes could be chosen to ensure that if the first pair of electrodes was in a "null" position, then the second pair of electrodes would be near a maximum. A detector and/or a switch could be used to allow the pair of electrodes receiving the largest voltage signal to be selected, e.g. by a signal processing unit.

Figure 4:
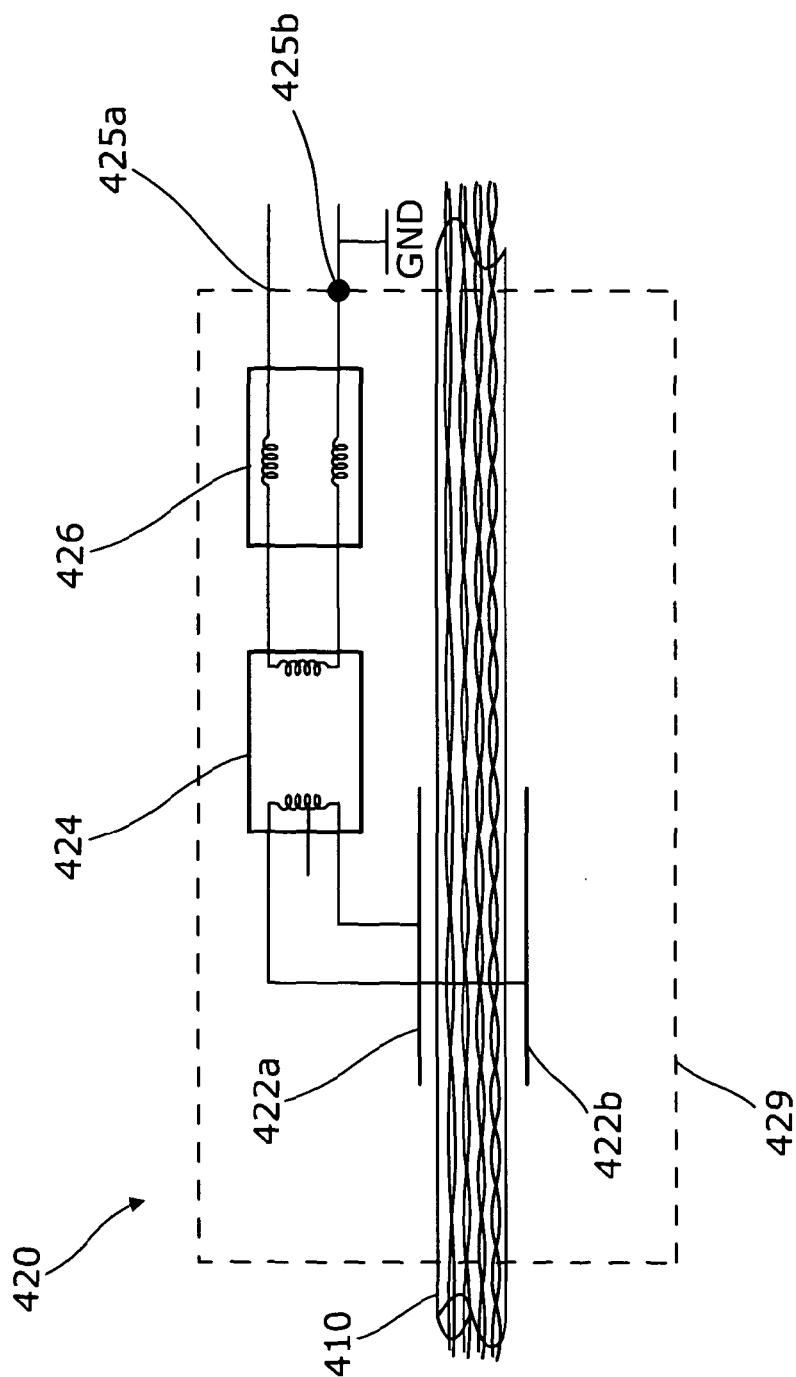
FIG. 4 shows a coupling unit which may be used in the network interconnection identification apparatus of FIG. 2.

FIG. 4 shows a coupling unit 420 which may be used in the network interconnection identification apparatus 200 of FIG. 2, e.g. as a first or second coupling unit. The coupling unit 420 is capable of coupling a voltage signal, which may be a test signal, generated by a signal generating unit into (or out from) a twisted pair cable 410 by non-contact coupling so that the voltage signal propagates (or after the signal has propagated) between at least two twisted pairs in the twisted pair cable 410. The coupling unit shown in FIG. 4 was also shown and described in UK patent application number GB0905361.2, U.S. patent application Ser. No. 11/597,575 and International patent application number PCT/GB2010/000594, also by the present inventors.

The coupling unit 420 includes a first electrode 422a and a second electrode 422b. The coupling unit 420 preferably includes a voltage signal coupling means which may include a first terminal 425a, a second terminal 425b, an electrical isolating means 424 in the form of a balun, and a converting means 426 in the form of a choke. The coupling unit 420 preferably includes shielding 429 in the form of an electrostatic screen which encloses the electrodes 422a, 422b, the electrical isolating means 424 and the converting means 426, and is preferably connected to the local ground GND, e.g. via the second terminal 425b. A suitable balun for the electrical isolating means 122 may be Mini-Circuits® type MCL506T2-T1. A suitable choke for the converting means 124 may be Mini-Circuits® type MCL750T1-1.

To couple a voltage signal into a twisted pair cable 410, the first terminal 425a may be connected to a signal generating unit (not shown). The second terminal 425b may be connected to a local ground GND for the signal generating unit.

A voltage signal generated by the signal generating unit may be a single-ended voltage signal which is converted into a differential voltage signal by the converting means 426, e.g. the choke, in the manner known to those skilled in the art. For example, if the signal generating unit produced a sinusoidal voltage expressed (in complex phasor notation) as $V.\exp(j\omega t)$; then the voltages outputted by the converting means 426 may be expressed as $V.\exp(j\omega t)/2$ and $-V.\exp(j\omega t)$. The differential voltage signal from the converting means 426 is then coupled to the electrodes 422a, 422b via the electrical isolating means 424, which electrically isolates the electrodes 422a, 422b from the signal generating unit.

The electrodes 422a, 422b of the coupling unit 420 may be the same as the electrodes described with reference to FIGS. 3a and 3b, and may couple the voltage signal into the twisted pair cable 410 in the same manner.

As explained in UK patent application number GB0905361.2, U.S. patent application Ser. No. 11/597,575 and International patent application number PCT/GB2010/000594, also by the present inventors, the inventors have found that a voltage signal which propagates along a twisted pair cable between two of the twisted pairs can propagate reliably and over useful distances, without significantly altering the transmission of signals within the individual twisted pairs. In particular, the inventors have found that coupling a voltage signal to a twisted pair cable using electrically isolated electrodes can help to reduce leakage of the voltage signal from the cable, e.g. through neighbouring twisted pair cables.

To couple a voltage signal out from the twisted pair cable 410, the first terminal 425a may be connected to a signal processing unit (not shown). The second terminal 425b may be connected to a local ground GND for the signal processing unit.

The electrodes 422a, 422b of the coupling unit 420 may be the same as the electrodes described with reference to FIGS. 3a and 3b, and may couple a voltage signal out from the twisted pair cable 410 in same manner. The voltage signal coupled out from the twisted pair cable 410 can then be coupled to the signal processing unit via the electrical isolating means 426 and the converting means 426. The voltage signal received by the electrodes 422a, 422b may be a differential voltage signal which may be converted to a single-ended voltage by the converting means 426, e.g. the choke, in the manner known to those skilled in the art.

Figure 5A:
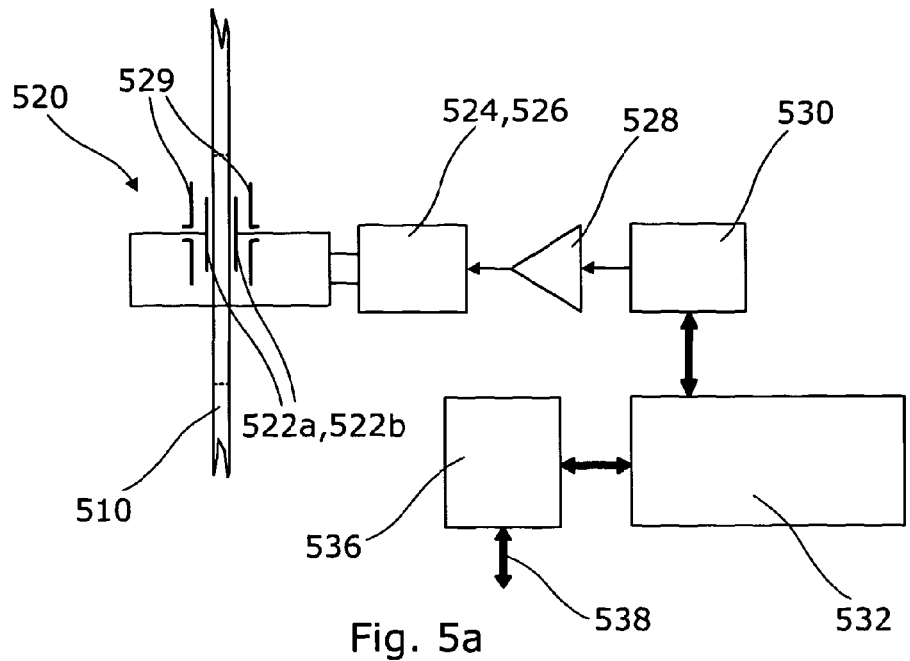
FIGS. 5a and 5b respectively show a first coupling unit and circuitry associated with the first coupling unit for coupling a voltage signal into a twisted pair cable and a second coupling unit and circuitry associated with the second coupling unit for coupling a voltage signal out from a twisted pair cable.

FIG. 5a shows a first coupling unit 520 and circuitry associated with the first coupling unit 520 for coupling a voltage signal, e.g. a first test signal, into a twisted pair cable 510. The first coupling unit 520 may be used in the network interconnection identification apparatus 200 shown in FIG. 2.

As shown in FIG. 5a, the first coupling unit 520 includes a pair of electrodes 522a, 522b, an electrical isolating means 524 in the form of a balun, a converting means 526 in the form of a choke, an amplifier 528, and shielding 529. The electrodes 522a, 522b, the electrical isolating means 524 and the converting means 526 may be as described above with reference to FIGS. 3 and 4. The shielding 529 shields the electrodes 522a, 522b from external electromagnetic fields, e.g. from other nearby twisted pair cables and nearby coupling units.

The coupling unit 520 preferably has a housing (not shown) arranged to be clipped on to the twisted pair cable 510 (e.g. by way of a suitable channel in the coupling unit or suitable retention lugs) such that the pair of electrodes 522a, 522b contact directly opposite sides of an outer surface of the twisted pair cable 510. The housing may include some or all of the components of the second coupling unit 540.

The circuitry associated with the first coupling unit 520 preferably includes one or more of a direct signal synthesizer 530, a field programmable gate array 532, and a processor 536, all of which are preferably connected as shown in FIG. 5a. The processor 536 may be connected to, and controlled by, a control unit (not shown) by way of a serial link 538. The direct signal synthesizer 530, field programmable gate array 532 and processor 536 may be shared by a plurality of the first coupling units 520, e.g. in a network interconnection identification apparatus such as that shown in FIG. 2.

The circuitry associated with the first coupling unit 520 forms a signal generating unit configured to generate a voltage signal, e.g. a first test signal, to be coupled to a twisted pair cable 510 by the electrodes 522a, 522b of the coupling unit 520. The signal generating unit may be used, for example, with the network interconnection identification apparatus 200 shown in FIG. 2.

In operation, the direct signal synthesizer 530 is preferably controlled by the field programmable gate array 532 and processor 536 to generate a voltage signal, e.g. a single-ended voltage signal to be supplied to the coupling unit 520. Once generated, the single-ended voltage signal from the direct signal synthesiser 530 is amplified by the amplifier 528, and is then converted into a differential voltage signal and coupled to the twisted pair cable 510 by the converting means 524, the electrical isolating means 522 and the first pair of electrodes 522a, 522b of the coupling unit 520 in the manner described above with reference to FIGS. 3 and 4, i.e. such that the voltage signal propagates between at least two of the twisted pairs in the twisted pair cable 510.

Figure 5B:
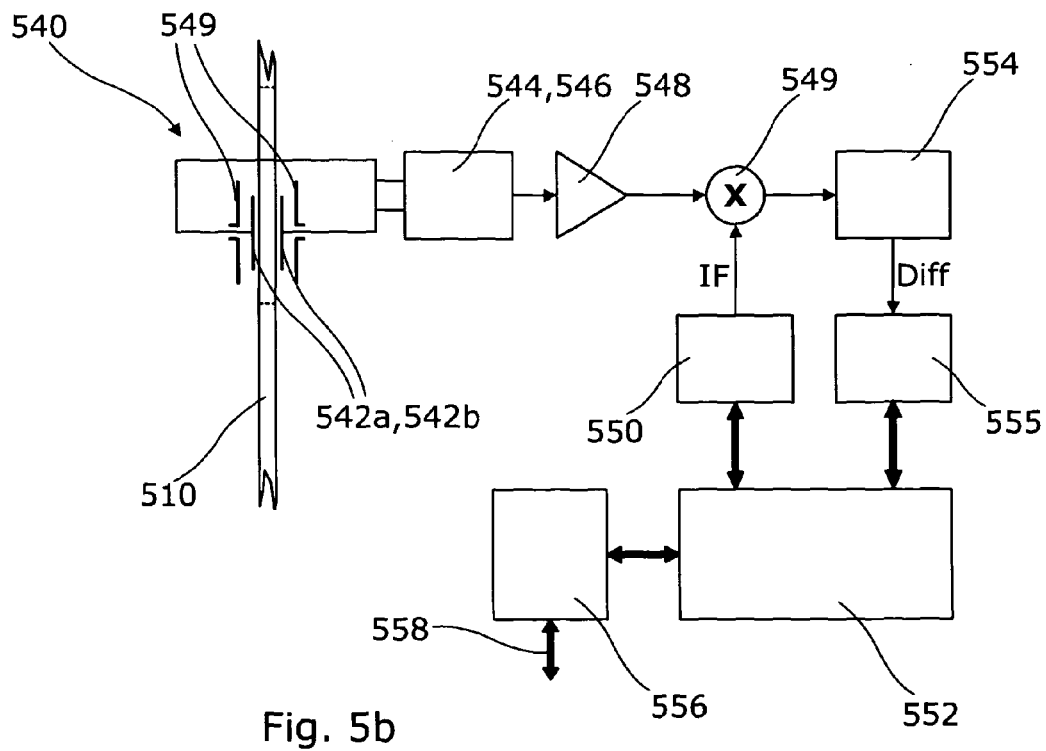

FIG. 5b shows a second coupling unit 540 and circuitry associated with the second coupling unit 540 for coupling a voltage signal, e.g. a second test signal, out from a twisted pair cable 510. The second coupling unit 540 may be used e.g. in the apparatus shown in FIG. 2.

As shown in FIG. 5b, the second coupling unit 540 includes a pair of electrodes 542a, 542b, an electrical isolating means 544 in the form of a balun, a converting means 546 in the form of a choke, an amplifier 548, and shielding 549. The electrodes 542a, 542b, the electrical isolating means 524 and the converting means 526 may be as described above with reference to FIGS. 3 and 4. As with the first coupling unit shown in FIG. 5a, the shielding 549 shields the electrodes 542a, 542b from external electromagnetic fields, e.g. from other nearby twisted pair cables and nearby coupling units.

As with the first coupling unit shown in FIG. 5a, the second coupling unit 540 preferably has a housing (not shown) arranged to be clipped on to the twisted pair cable 510 (e.g. by way of a suitable channel in the coupling unit or suitable retention lugs) such that the pair of electrodes 522a, 522b contact directly opposite sides of an outer surface of the twisted pair cable 510. The housing may include some or all of the components of the first coupling unit 520.

The circuitry associated with the second coupling unit 540 preferably includes one or more of a multiplier 549, a direct signal synthesizer 550, a field programmable gate array 552, a low pass filter and amplifier 554, an analogue to digital converter 555 and a processor 556, all of which are preferably connected as shown in FIG. 5b. The processor 556 may be connected to, and controlled by, a control unit (not shown) by way of a serial link 558. The direct signal synthesizer 550, the field programmable gate array 552, the low pass filter and amplifier 554, the analogue to digital converter 555, and the processor 556 may be shared by a plurality of the second coupling units 540, e.g. in a network interconnection identification apparatus such as that shown in FIG. 2.

The circuitry associated with the second coupling unit 540, including the processor 556, forms a signal processing unit configured to analyse one or more characteristics of a voltage signal, e.g. a second test signal, coupled out by the second coupling unit 540. The signal processing unit may be used, for example, with the network interconnection identification apparatus 200 shown in FIG. 2.

In operation, when a voltage signal which propagates between twisted pairs propagates along the twisted pair cable 510 to the second coupling unit 540, the voltage signal is coupled out of the twisted pair cable 510 and converted into a single-ended voltage signal by the pair of electrodes 542a, 542b, the electrical isolating means 544 and the converting means 546 of the coupling unit 540 in the manner described above with reference to FIGS. 3 and 4. The single-ended voltage signal is then amplified by the amplifier 548, demodulated by the multiplier 549 and the low pass filter and amplifier 554 and is then passed to the analogue to digital converter 550 where it is converted into a digital signal. A final stage of demodulation is performed by the field programmable gate array 552 and the digital signal is then passed to the processor 556.

A plurality of the first coupling units 520 shown in FIG. 5a may be used as first coupling units in the network interconnection identification apparatus 200 shown FIG. 2, with the associated circuitry shown in FIG. 5a being used as the signal generating unit for generating a first test signal. Similarly, a plurality of the second coupling units 540 shown in FIG. 5b may be used as second coupling units in the network interconnection identification apparatus 200 shown in FIG. 2, with the associated circuitry shown in FIG. 5b being used as the signal processing unit for determining, for at least one respective test signal, which of conditions (i) and (ii), if any, is true. This determination could, for example, be made by the processor 556.

As would be appreciated by a person skilled in the art of signal processing, a large number of different characteristics of a second test signal could be analysed by the signal processing unit to determine whether a second test signal is a direct signal or a crosstalk signal. Some of these characteristics, and techniques for analysing these characteristics to distinguish between direct signals and crosstalk signals will now be discussed, with reference to FIGS. 6-11.

Figure 6:
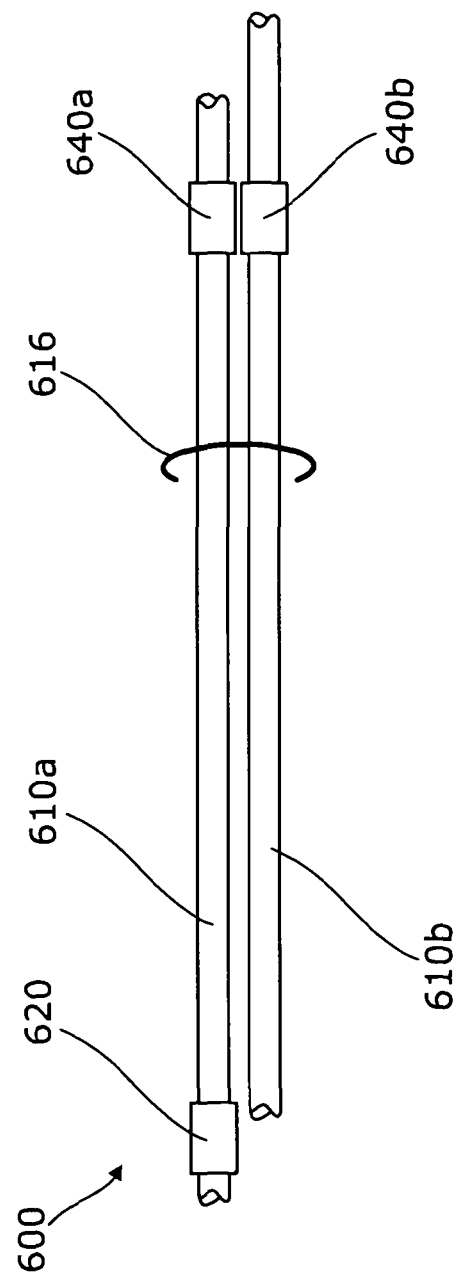
FIG. 6 shows an experimental arrangement for demonstrating the different characteristics of direct signals and crosstalk signals.

FIG. 6 shows an experimental arrangement 600 for demonstrating the different characteristics of direct signals and crosstalk signals.

The experimental arrangement 600 shown in FIG. 6 has first and second cables 610a, 610b, which are separate and unterminated lengths of category 5 UTP cable that have been taped closely together by tape 616.

A first coupling unit 620, which has features corresponding to the first coupling unit 520 shown in FIG. 5a, is coupled to the first cable 610a to allow the first coupling unit 620 to couple a first test signal into the first cable 610a. Two second coupling units 640a, 640b, each having features corresponding to the second coupling unit 540 shown in FIG. 5b, are each coupled to a respective one of the first and second cables 610a, 610b at an opposite end from the first coupling unit 620. The second coupling unit 640a is attached to the first cable 610a, i.e. the same cable as the first coupling unit 620, and therefore will couple out a second test signal that is a direct signal. The other of the second coupling units 640b is attached to the second cable 610b, i.e. a different cable from the cable to which the first coupling unit 620 is coupled, and will therefore couple out a second test signal that is a crosstalk signal.

Figure 7:
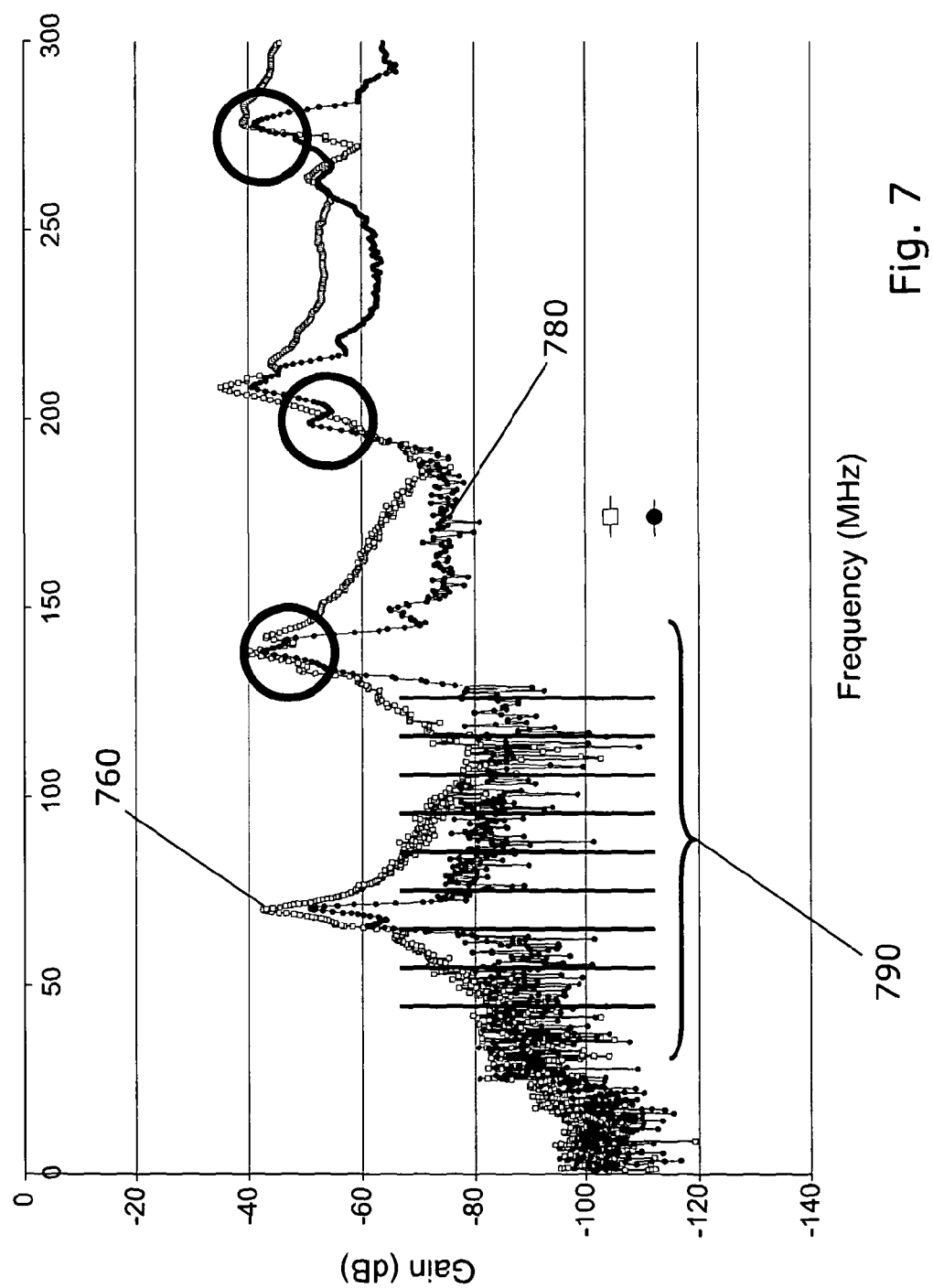
FIG. 7 shows amplitude-frequency plots for a direct signal and a corresponding crosstalk signal produced using the apparatus of FIG. 6.

FIG. 7 shows amplitude-frequency plots for a direct signal 760 and a crosstalk signal 780 produced using the apparatus 600 of FIG. 6. To produce the plot shown in FIG. 7, category 5 UTP cables of length 2 meters were used as the first and second cables 600a, 600b. The first test signal coupled into the first cable 610a was a wideband frequency sweep from 956 kHz to 300 MHz containing approximately 1000 different frequencies. The phase and magnitude of the second test signal coupled out by the second coupling units 640a, 640b were recorded. The recorded phase and magnitude data was used directly to produce the amplitude-frequency plots of FIG. 7.

As shown in FIG. 7, the average (e.g. root mean square) amplitude (energy) of the direct signal 760 generally higher than that of the crosstalk signal 780. Therefore, the amplitude of a second test signal coupled out by a second coupling unit at a selected frequency is indicative of whether that second test signal is a direct signal or a crosstalk signal.

Accordingly, the one or more characteristics of a second test signal analysed by a signal processing unit to determine whether that second test signal is a direct signal or a crosstalk signal may include the amplitude of the second test signal.

As would be appreciated by a person skilled in the art of signal processing, there are a large number of possible techniques for analysing the amplitude of a second test signal to determine whether that second test signal is a direct signal or a crosstalk signal.

A potential issue with analysing the amplitude of a test signal to distinguish between direct and crosstalk signals is illustrated by FIG. 7. Here, the respective amplitudes of the direct signal 760 and the crosstalk signal 790 (particularly the crosstalk signal 780) are strongly dependent on frequency. Thus, whilst the amplitude of the direct signal 760 is larger than the amplitude of the crosstalk signal 780 for most frequencies, there are certain frequencies at which the amplitude of the crosstalk signal 780 is larger than the amplitude of the direct signal 760 (see the circled portions of FIG. 7). For a given cable, these certain frequencies typically correspond to values of the resonant frequencies of the cable, which are determined by the length and termination conditions of the cable. The amplitude of the crosstalk signal may therefore be higher where the resonances in the first and second cables 610a, 610b overlap.

To address this issue, in a presently preferred technique, the one or more characteristics of a second test signal analysed by a signal processing unit to determine whether that second test signal is a direct signal or a crosstalk signal include the amplitude of the second test signal as measured at a plurality of frequencies.

For example, the amplitude of the second test signal could be measured at nine different frequencies 790, as shown in FIG. 7. Preferably, the frequencies 790 are non-integer multiples of each other, in order to avoid harmonics. Preferably, the different frequencies 790 are in the range 30 to 150 MHz. The amplitude of the second test signal measured at each frequency could, for example, be combined (e.g. using a weighted sum) to create a parameter which characterises the overall amplitude of the signal over a frequency range. If the parameter exceeds an upper threshold, then the second test signal could be determined to be a direct signal. If the parameter is below a lower threshold, then the second test signal could be determined to be a crosstalk signal. If the parameter was in between the upper and lower thresholds, then the second coupling unit that coupled out the second test signal could be shortlisted as having potentially coupled out a direct signal. Suitable upper and/or lower thresholds could be determined empirically.

As illustrated by FIG. 7, the amplitude-frequency plot for the direct signal 760 has a different shape to the amplitude-frequency plot for the cross-talk signal 780. In particular, the amplitude-frequency plot for the crosstalk signal 780 has sharper resonances, which reflect, for example, cable length and the coupling paths between the first and second cables 610a, 610b.

Accordingly, the one or more characteristics of a second test signal analysed by a signal processing unit to determine whether that second test signal is a direct signal or a crosstalk signal may include an amplitude-frequency characteristic of the test signal, e.g. a parameter which reflects the shape of an amplitude-frequency plot for the test signal.

Figure 8A:
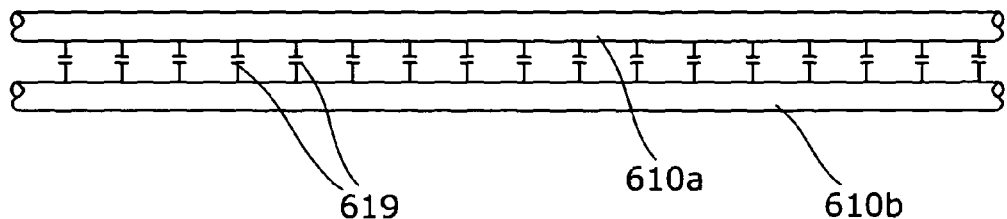
FIGS. 8a-c are schematic diagrams showing a direct signal and a crosstalk signal produced using the apparatus of FIG. 6 in the time domain.
Figure 8B:
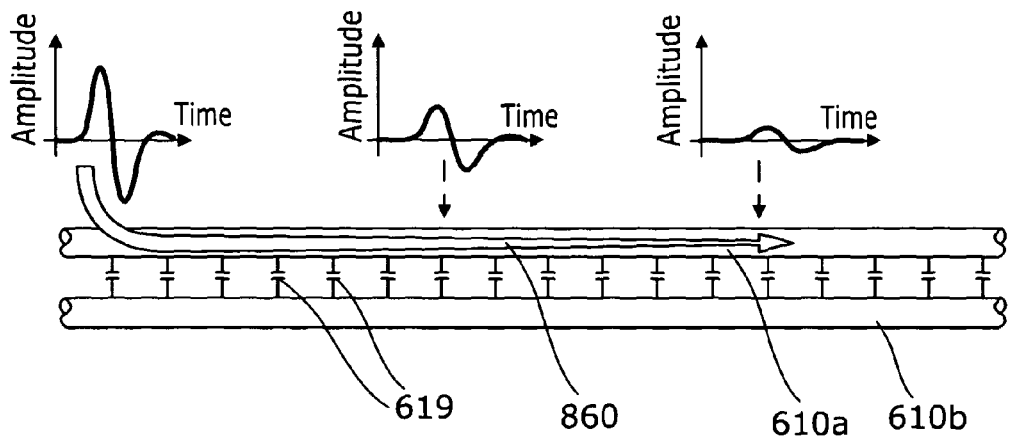
Figure 8C:
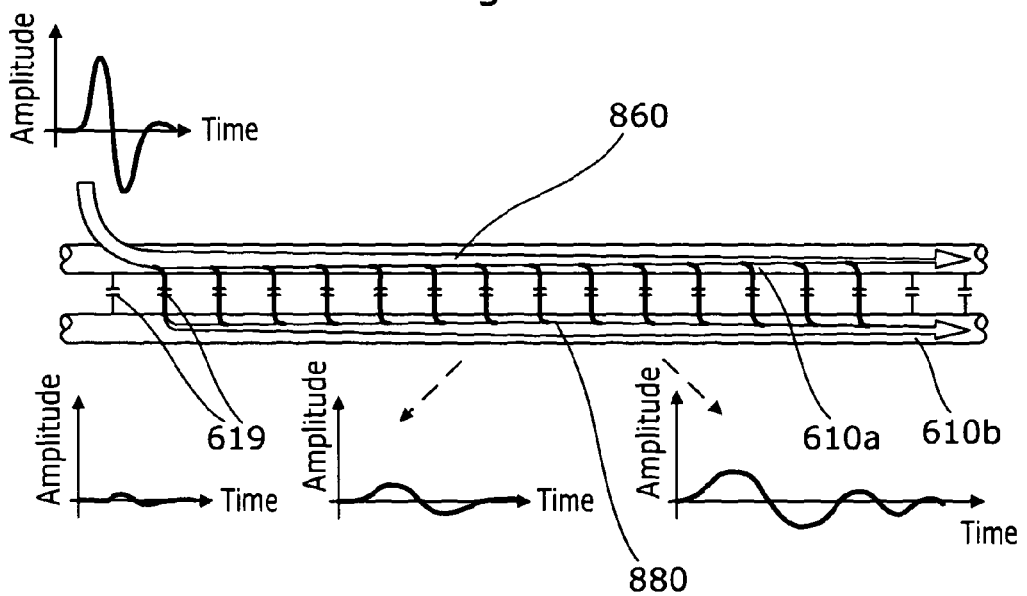

FIGS. 8a-c are schematic diagrams showing a direct signal 860 and a crosstalk signal 880 produced using the apparatus 600 of FIG. 6 in the time domain. To produce the signals depicted in FIGS. 8a-c, a transient first test signal including one cycle of a sine wave is assumed to have been coupled into the first cable 610a by the first coupling unit 620. The transient first test signal could be generated, for example, using a frequency sweep and Fourier analysis techniques, which are known in the art.

FIGS. 8a-c show a plurality of coupling paths 619 between the first cable 610a and the second cable 610b, via which energy coupled into the first cable 610a may propagate into the second cable 610b. In FIG. 8, the coupling paths 619 are depicted as capacitive coupling paths.

As shown in FIG. 8b, the direct signal 860 propagates along the first cable 610a in both directions and the passage of the direct signal along the first cable 610a is recorded at the second coupling unit 640a. If the cable is long (such as tens of meters) or is terminated with resistors that are impedance matched to the characteristic impedance of the cable, and in addition, if the cable has no discontinuities such as connectors, then the direct signal 860 will propagate without significant reflections, and will simply attenuate with distance, as shown in FIG. 8b.

As shown in FIG. 8c, the crosstalk signal 880 is coupled into the second cable 610b in a distributed manner via the coupling paths 619 along the length thereof. Accordingly, the crosstalk signal 880 received by the second coupling unit 640b is dispersed over a longer period of time, as shown in FIG. 8c. The crosstalk signal will be stronger if the first and second cables 610a, 610b have a similar construction.

Figure 9:
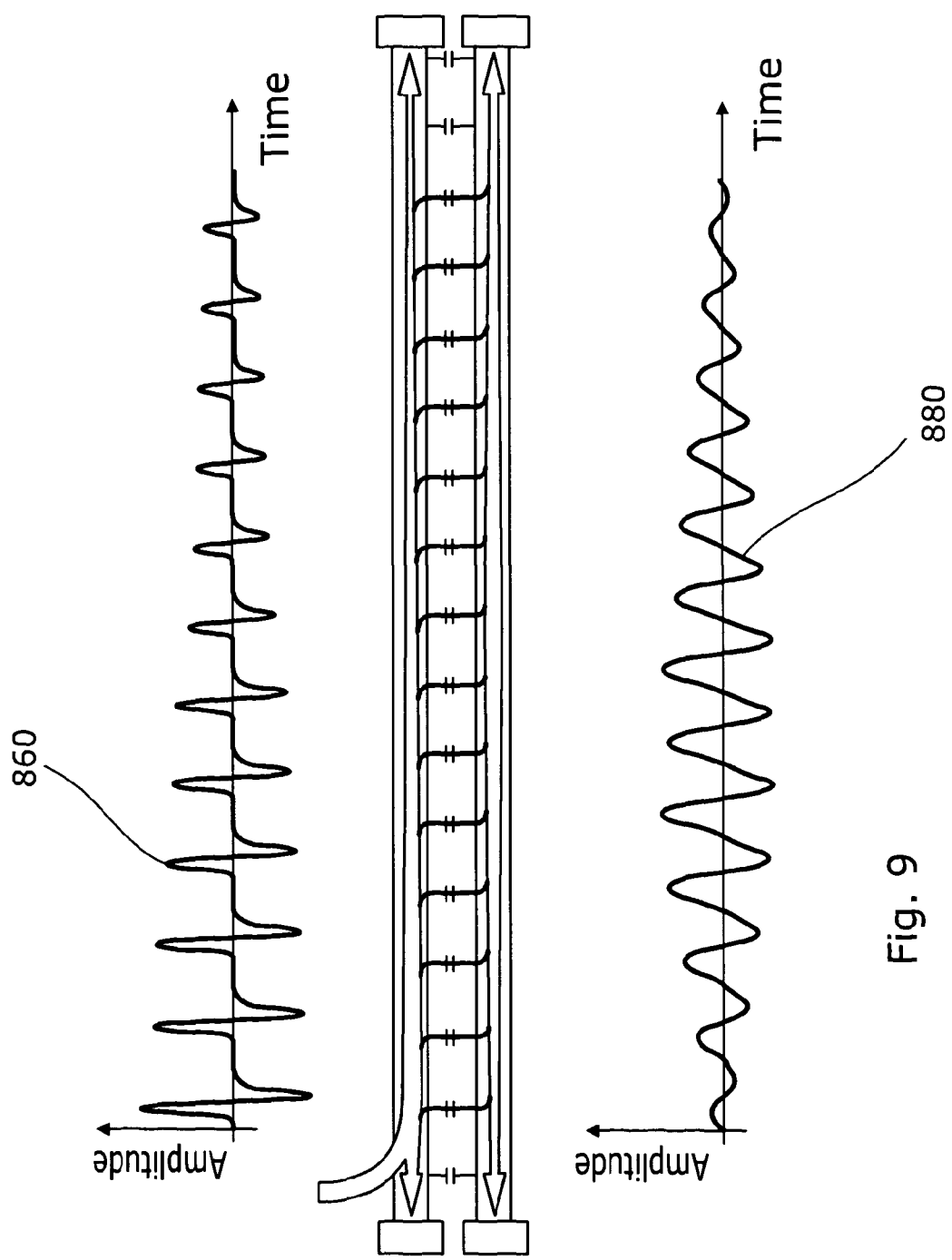
FIG. 9 shows theoretical amplitude-time plots for the direct signal and the crosstalk signal described with reference to FIG. 8.

FIG. 9 shows theoretical amplitude-time plots for the direct signal 860 and the crosstalk signal 880 described with reference to FIG. 8.

As shown in the upper plot of FIG. 9, the direct signal 860 tends to attenuate with time. This is because all the energy from the transient first test signal is coupled into the first cable 610a cable over a relatively short interval of time. The direct signal 860 therefore propagates along the first cable 610a in both directions. Reflections are caused by changes in impedance along the cable, but overall the magnitude of the signal decays in time as the energy coupled by the transmitter dissipates in the cable due to resistive, capacitive and inductive losses.

As shown in the lower plot of FIG. 9, the crosstalk signal 880 behaves differently to the direct signal 860. Here, energy from the transient first test signal is coupled into the second cable 610b over a period of time and the coupling is distributed over the length of the second cable 610b. Consequently, the crosstalk signal 880 builds up over an initial period as the transient test signal propagates forward and backward along the second cable 610b.

After a period of time both the direct signal 860 and the crosstalk signal 880 decay to zero as the energy dissipates due to resistive, capacitive and inductive losses in the first and second cables 610a, 610b.

Figure 10A:
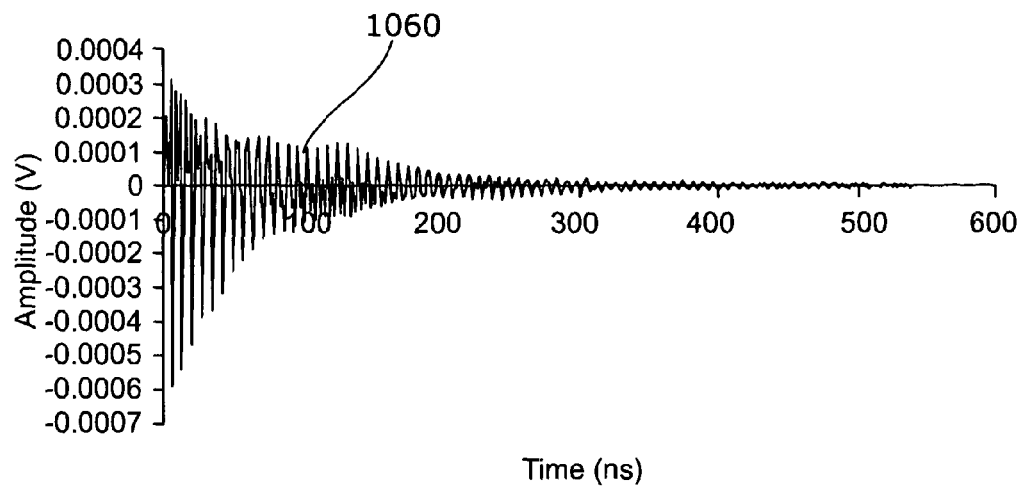
FIGS. 10a and 10b respectively show amplitude-time plots for a direct signal and a crosstalk signal produced using the apparatus of FIG. 6.
Figure 10B:
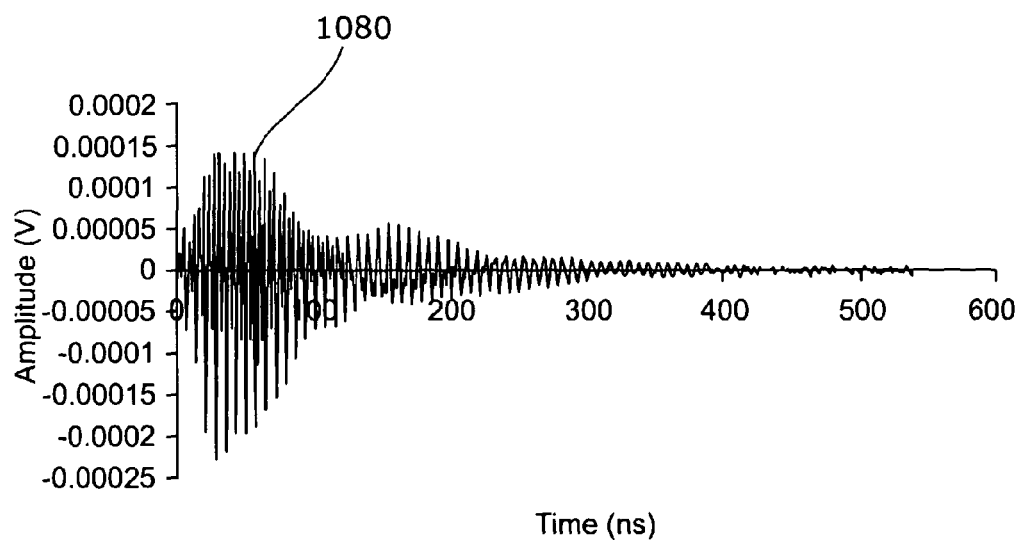

FIGS. 10a and 10b respectively show amplitude-time plots for a direct signal 1060 and a crosstalk signal 1080 produced using the apparatus 600 of FIG. 6. The amplitude-time plots of FIGS. 10a and 10b were produced by using a Fourier transform to transform the phase and magnitude data recorded to produce the plots of FIG. 7, for which category 5 UTP cables of length 2 meters were used.

FIG. 10a clearly shows the amplitude of the direct signal 1060 decaying over time. FIG. 10b shows that, in contrast to the direct signal 1060, the amplitude of the crosstalk signal 1080 initially builds up, this initial build up being followed by a gradual decay over the remaining period.

As can be seen from FIGS. 8-10, the amplitude-time characteristics for a direct signal are different to the amplitude-time characteristics for a crosstalk signal. In particular, a crosstalk signal is dispersed over a longer period of time than a direct signal, and a crosstalk signal builds-up gradually and then decays rather than simply decaying in the manner of a direct signal.

Accordingly, the one or more characteristics of a second test signal analysed by a signal processing unit to determine whether that second test signal is a direct signal or a crosstalk signal may include an amplitude-time characteristic of the test signal.

As would be appreciated by a person skilled in the art of signal processing, there are a large number of possible techniques for analysing one or more amplitude-time characteristics of a second test signal to determine whether that second test signal is a direct signal or a crosstalk signal.

A presently preferred technique involves calculating the root mean square of the amplitude of the second test signal for each of a plurality of time intervals. In other words, the amplitude-time characteristic of the second test signal may include the root mean square of the amplitude of the second test signal as calculated for each of a plurality of time intervals.

For the data recorded in FIGS. 10a and 10b, the root mean square of the amplitude of the second test signals was calculated for eleven time intervals of duration 50 ns, starting from 0 ns as marked in FIGS. 10a and 10b (i.e. from 0 ns to 50, 50 ns to 100 ns and so on with the last time interval being 500 ns to 550 ns). A direct signal will have the largest root mean square value during the first 50 ns time interval than in subsequent time intervals. The crosstalk signal on the other hand will have a different profile, with the largest root mean square value not being during the first 50 ns time interval.

Figure 11A:
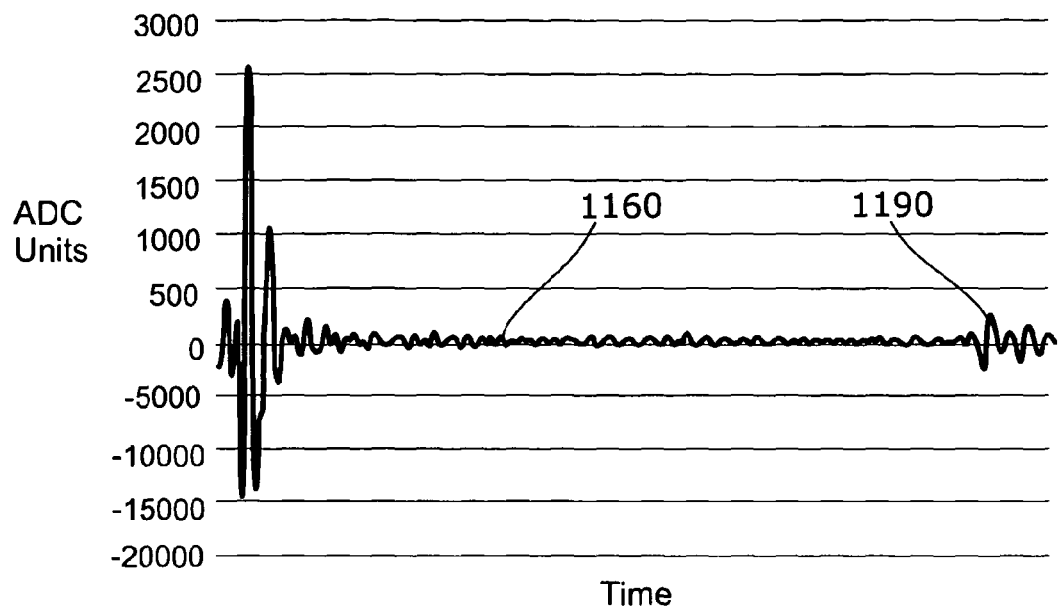
FIGS. 11a and 11b respectively show amplitude-distance plots for a direct signal and a crosstalk signal produced using the apparatus of FIG. 6.
Figure 11B:
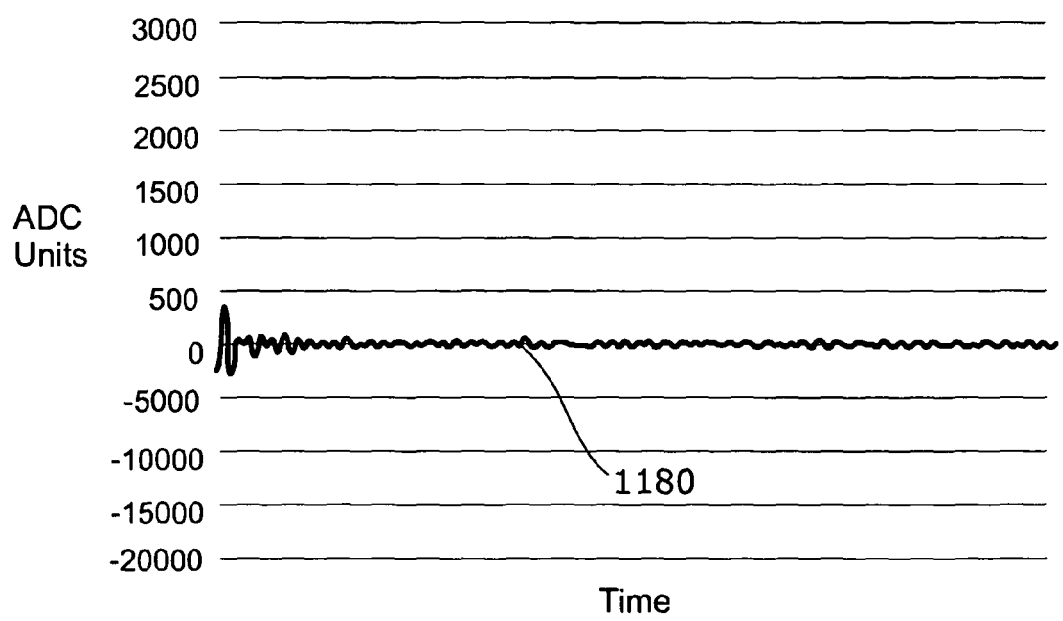
Figure 12:
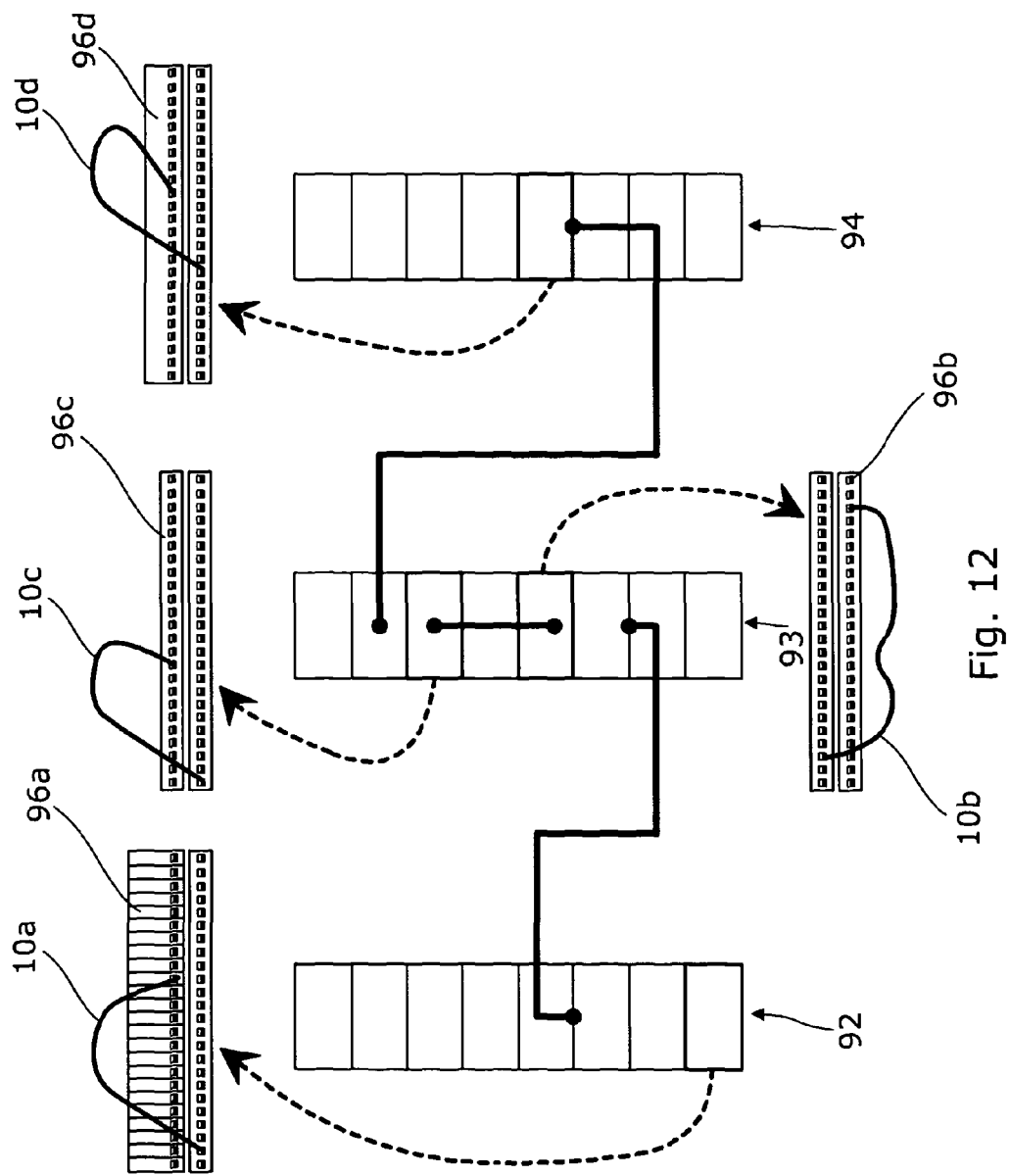
FIG. 12 shows a typical patch system organised into a server row, a cross-connect row and a network row.

FIGS. 11a and 11b respectively show amplitude-time plots for a direct signal 1160 and a crosstalk signal 1180 produced using the apparatus 600 of FIG. 6. To produce the plot shown in FIG. 11, category 5 UTP cables of length 90 meters were used. The first test signal coupled into the first cable 610a was a transient first test signal including several cycles of a sine wave, and was produced using a frequency sweep and Fourier analysis techniques, which are known in the art.

As shown in FIG. 11, the direct signal 1160 has a large initial amplitude. In addition a reflection 1190 from an end of the first cable 610a is also visible. The shape of the direct signal 1160 is consistent with the transient first test signal. The crosstalk signal 1180 on the other hand has lower overall amplitude, and does not display a shape consistent with a signal that has propagated along a single cable line.

As can be seen from FIG. 11, the amplitude-time characteristics for a direct signal are different to the amplitude-time characteristics for a crosstalk signal. In particular, the crosstalk signal 1180 is dispersed over a longer period of time than the direct signal.

As already noted above, the one or more characteristics of a second test signal analysed by a signal processing unit to determine whether that second test signal is a direct signal or a crosstalk signal may include an amplitude-time characteristic of the second test signal.

Another possible technique for analysing one or more amplitude-time characteristics of a second test signal to determine whether that second test signal is a direct signal or a crosstalk signal involves cross-correlating each of a plurality of second test signals coupled out by second coupling units with a reference signal known to be a direct signal. Cross-correlating a direct signal would produce a peak in the cross-correlated signal. The position of the peak on the time axis would correspond to the time of propagation of the signal from the first coupling unit to the second coupling unit. As the speed of propagation for the cable is constant, this would correspond to the electrical length of the cable between the two coupling units. Cross-correlating a crosstalk signal would produce a cross-correlated signal having values close to zero. A threshold, e.g. determined empirically, could be applied to the cross-correlated signal to determine whether each second test signal coupled out by the second coupling units is a direct signal or a crosstalk signal.

Where the length of the cable lines 610a, 610b is short compared to the length of the transient test signal coupled into the first cable line 610a by the first coupling unit 620, for example just several meters, the multiple reflections from any unterminated ends of the cable and from discontinuities may start to overlap. In this case, the time domain response becomes more complicated than that shown in FIG. 11 (as illustrated e.g. by FIGS. 10a and 10b). Nevertheless, even in these cases, it has been found that a direct signal can still be clearly differentiated from a crosstalk signal.

When used in this specification and claims, the terms "comprises" and "comprising" and variations thereof mean that the specified features, steps or integers are included. The terms are not to be interpreted to exclude the presence of other features, steps or integers.

The features disclosed in the foregoing description, or in the following claims, or in the accompanying drawings, expressed in their specific forms or in terms of a means for performing the disclosed function, or a method or process for obtaining the disclosed results, as appropriate, may, separately, or in any combination of such features, be utilised for realising the invention in diverse forms thereof.

While the invention has been described in conjunction with the exemplary embodiments described above, many equivalent modifications and variations will be apparent to those skilled in the art when given this disclosure, without departing from the broad concepts disclosed. It is therefore intended that the scope of the patent granted hereon be limited only by the appended claims, as interpreted with reference to the description and drawings, and not by limitation of the embodiments described herein.

We claim:

1. A signal processing apparatus for use with a plurality of cable lines, the signal processing apparatus having:
   a signal generating unit configured to generate a first test signal;
   a first coupling unit configured to couple to a first one of the plurality of cable lines and to couple a first test signal generated by the signal generating unit into the first cable line by non-contact coupling with the conductors of the first cable line such that the first test signal propagates along the first cable line between at least two conductors in the first cable line, wherein the first coupling unit includes:
   first and second electrodes arranged to produce an electric field therebetween to couple a voltage signal into a twisted pair cable by non-contact coupling with twisted pairs in the twisted pair cable so that the voltage signal propagates along the twisted pair cable between at least two of the twisted pairs, and electrical isolation means arranged to electrically isolate the electrodes from the signal generating unit;

a second coupling unit configured to couple to a second one of the plurality of cable lines and, if a second test signal is present in the second cable line, to couple the second test signal out from the second cable line by non-contact coupling with the conductors of the second cable line, wherein the second coupling unit includes:

first and second electrodes arranged to couple a voltage signal out from a twisted pair cable by non-contact coupling with at least two of the twisted pairs in the twisted pair cable between which the voltage signal has propagated, and electrical isolation means arranged to electrically isolate the electrodes from a signal processing unit; and, the signal processing unit configured to, if the second coupling unit couples a second test signal out from a second one of the plurality of cable lines, analyze one or more characteristics of the second test signal to determine, based on the one or more analyzed characteristics, which of the following conditions, if any, is true:

(i) the second test signal is a direct signal that has propagated directly from the first coupling unit to the second coupling unit via a single cable line to which the first and second coupling units are coupled;

(ii) the second test signal is a crosstalk signal that has propagated indirectly from the first coupling unit to the second coupling unit via one or more coupling paths between different cable lines to which the first and second coupling units are respectively coupled.

2. A signal processing apparatus according to claim 1 wherein:

the apparatus has a plurality of first coupling units, each first coupling unit being configured to couple to a respective first one of the plurality of cable lines and to couple a respective first test signal generated by the signal generating unit into the respective first cable line such that the respective first test signal propagates along the respective first cable line between at least two conductors in the respective first cable line;

the apparatus has a plurality of second coupling units, each second coupling unit being configured to couple to a respective second one of the plurality of cable lines and, if a respective second test signal is present in the respective second cable line, to couple the respective second test signal out from the respective second cable line;

the signal processing unit is configured to, if any one or more of the second coupling units couples out a respective second test signal, analyze one or more characteristics of each respective second test signal to determine, for at least one respective second test signal, based on the one or more analyzed characteristics, which of the following conditions, if any, is true:

(i) the respective second test signal is a direct signal that has propagated directly from a first coupling unit to a second coupling unit via a single cable line to which the first and second coupling units are coupled;

(ii) the respective second test signal is a crosstalk signal that has propagated indirectly from a first coupling unit to the second coupling unit via one or more coupling paths between different cable lines to which the first and second coupling units are respectively coupled.

3. A test signal processing apparatus according to claim 1 wherein:

the signal processing unit is configured to, if it determines that a second test signal coupled out by a second coupling unit is a direct signal that has propagated directly from a first coupling unit to the second coupling unit via a single cable line to which the first and second coupling units are coupled, identify an interconnection between a first port associated with that first coupling unit and a second port associated with that second coupling unit.

4. A test signal processing apparatus according to claim 1 wherein the one or more characteristics of each second test signal analyzed by the signal processing unit include any one or more of the following characteristics:

the amplitude of the second test signal;

the amplitude of the second test signal as measured at a plurality of frequencies;

the phase of the second test signal;

the phase of the second test signal as measured at a plurality of frequencies;

an amplitude-frequency characteristic of the second test signal;

an amplitude-distance characteristic of the second test signal; and an amplitude-time characteristic of the second test signal.

5. A test signal processing apparatus according to claim 1, wherein:

the signal generating unit is configured to generate a first test signal suitable for performing frequency domain reflectometry; and the one or more characteristics of each second test signal analyzed by the signal processing unit includes an amplitude-frequency characteristic.

6. A test signal processing apparatus according to claim 5, wherein the first test signal is a wideband frequency sweep.

7. A test signal processing apparatus according to claim 5, wherein the amplitude-frequency characteristic is the amplitude of each second test signal as measured at a plurality of frequencies.

8. A test signal processing apparatus according to claim 1, wherein:

the signal generating unit is configured to generate a first test signal suitable for performing time domain reflectometry; and the one or more characteristics of each second test signal analyzed by the signal processing unit includes an amplitude-time characteristic.

9. A test signal processing apparatus according to claim 8, wherein the first test signal is a narrow transient test signal.

10. A test signal processing apparatus according to claim 8, wherein the amplitude-time characteristic includes the root mean square of the amplitude of the second test signal as calculated for each of a plurality of time intervals.

11. A test signal processing apparatus according to claim 1 wherein the signal processing unit is configured to, if it determines that a second test signal coupled out by a second coupling unit is a crosstalk signal, measure the magnitude of the crosstalk signal.

12. A test signal processing apparatus according to claim 1 wherein:

the signal generating unit is configured to generate a first test signal of a first type and a first test signal of a second type;

there is a plurality of the second coupling units;

the signal processing unit is configured to, if more than one of the second coupling units couples out a respective second test signal of the first type, analyze one or more characteristics of each respective second test signal of the first type to establish a shortlist of second coupling units, the shortlist including the second coupling units which are identified as having potentially coupled out a direct signal; and the signal processing unit is further configured to, if more than one of the shortlisted second coupling units couples out a respective second test signal of the second type, analyze one or more characteristics of each respective second test signal of the second type to determine which, if any, of the respective second test signals of the second type is a direct signal.

13. A signal processing method including:

generating, using a signal generating unit, a first test signal;

coupling, using a first coupling unit, the first test signal into a first one of a plurality of cable lines by non-contact coupling with the conductors of the first cable line such that the first test signal propagates along the first cable line between at least two conductors in the first cable line, wherein the first coupling unit includes:
  first and second electrodes arranged to produce an electric field therebetween to couple a voltage signal into a twisted pair cable by non-contact coupling with twisted pairs in the twisted pair cable so that the voltage signal propagates along the twisted pair cable between at least two of the twisted pairs, and
  electrical isolation means arranged to electrically isolate the electrodes from the signal generating unit;

coupling, using a second coupling unit, a second test signal out from a second cable line by non-contact coupling with the conductors of the second cable line, wherein the second coupling unit includes:
  first and second electrodes arranged to couple a voltage signal out from a twisted pair cable by non-contact coupling with at least two of the twisted pairs in the twisted pair cable between which the voltage signal has propagated, and
  electrical isolation means arranged to electrically isolate the electrodes from the signal processing unit; and analyzing one or more characteristics of the second test signal to determine, based on the one or more analyzed characteristics, which of the following conditions, if any, is true:
  (i) the second test signal is a direct signal that has propagated directly from the first coupling unit to the second coupling unit via a single cable line to which the first and second coupling units are coupled;
  (ii) the second test signal is a crosstalk signal that has propagated indirectly from the first coupling unit to the second coupling unit via one or more coupling paths between different cable lines to which the first and second coupling units are respectively coupled.

14. A signal processing method according to claim 13, wherein the method further includes if it is determined that a second test signal coupled out by a second coupling unit is a direct signal that has propagated directly from a first coupling unit to the second coupling unit via a single cable line to which the first and second coupling units are coupled, identifying an interconnection between a first port associated with that first coupling unit and a second port associated with that second coupling unit.

15. A signal processing apparatus for use with a plurality of cable lines, the signal processing apparatus having:
  a signal generating unit configured to generate a first test signal;
  a plurality of first coupling units, each first coupling unit being configured to couple to a respective first one of the plurality of cable lines and to couple a respective first test signal generated by the signal generating unit into the respective first cable line by non-contact coupling with the conductors of the first cable line such that the respective first test signal propagates along the respective first cable line between at least two conductors in the respective first cable line;
  a plurality of second coupling units, each second coupling unit being configured to couple to a respective second one of the plurality of cable lines and, if a respective second test signal is present in the respective second cable line, to couple the respective second test signal out from the respective second cable line by non-contact coupling with the conductors of the second cable line;
  a signal processing unit configured to, if any one or more of the second coupling units couples out a respective second test signal, analyze one or more characteristics of each respective second test signal to determine, for at least one respective second test signal, based on the one or more analyzed characteristics, which of the following conditions, if any, is true:
    (i) the respective second test signal is a direct signal that has propagated directly from one of the plurality of first coupling units to one of the plurality of second coupling units via a single cable line to which the first and second coupling units are coupled;
    (ii) the respective second test signal is a crosstalk signal that has propagated indirectly from one of the plurality of first coupling units to one of the plurality of second coupling units via one or more coupling paths between different cable lines to which the first and second coupling units are respectively coupled;
  wherein the signal processing unit is configured to, if it determines that the second test signal coupled out by one of the second coupling units is a direct signal that has propagated directly from one of the first coupling units to the second coupling unit via the single cable line to which the first and second coupling units are coupled, identify an interconnection between a first port associated with that first coupling unit and a second port associated with that second coupling unit;
  wherein each first coupling unit includes:
    first and second electrodes arranged to produce an electric field therebetween to couple a voltage signal into a twisted pair cable by non-contact coupling with twisted pairs in the twisted pair cable so that the voltage signal propagates along the twisted pair cable between at least two of the twisted pairs; and
    electrical isolation means arranged to electrically isolate the electrodes from the signal generating unit;
  wherein each second coupling unit includes:
    first and second electrodes arranged to couple a voltage signal out from a twisted pair cable by non-contact coupling with at least two of the twisted pairs in the twisted pair cable between which the voltage signal has propagated; and
    electrical isolation means arranged to electrically isolate the electrodes from the signal processing unit.

16. A signal processing apparatus for use with a plurality of cable lines, the signal processing apparatus having:
  a signal generating unit configured to generate a first test signal of a first type and a first test signal of a second type;
  a first coupling unit configured to couple to a first one of the plurality of cable lines and to couple a first test signal generated by the signal generating unit into the first cable line by non-contact coupling with the conductors of the first cable line such that the first test signal propagates along the first cable line between at least two conductors in the first cable line;

a plurality of second coupling units, each of the second coupling units being configured to couple to a second one of the plurality of cable lines and, if a second test signal is present in the second cable line, to couple the second test signal out from the second cable line by non-contact coupling with the conductors of the second cable line; and a signal processing unit configured to, if one of the second coupling units couples a second test signal out from a second one of the plurality of cable lines, analyze one or more characteristics of the second test signal to determine, based on the one or more analyzed characteristics, which of the following conditions, if any, is true:

(i) the second test signal is a direct signal that has propagated directly from the first coupling unit to the second coupling unit via a single cable line to which the first and second coupling units are coupled;

(ii) the second test signal is a crosstalk signal that has propagated indirectly from the first coupling unit to the second coupling unit via one or more coupling paths between different cable lines to which the first and second coupling units are respectively coupled;

wherein the signal processing unit configured to, if more than one of the second coupling units couples out a respective second test signal of the first type, analyze one or more characteristics of each respective second test signal of the first type to establish a shortlist of second coupling units, the shortlist including the second coupling units which are identified as having potentially coupled out a direct signal;

wherein the signal processing unit is further configured to, if more than one of the shortlisted second coupling units couples out a respective second test signal of the second type, analyze one or more characteristics of each respective second test signal of the second type to determine which, if any, of the respective second test signals of the second type is a direct signal.

* * * * *